(12) United States Patent
Miyachi et al.

(10) Patent No.: US 7,477,669 B2
(45) Date of Patent: Jan. 13, 2009

(54) SEMICONDUCTOR LASER DEVICE AND METHOD OF MANUFACTURING THE SAME

(75) Inventors: Mamoru Miyachi, Saitama (JP);
Yoshinori Kimura, Saitama (JP);
Kiyofumi Chikuma, Saitama (JP)

(73) Assignee: Pioneer Corporation, Tokyo (JP)

( * ) Notice: Subject to any disclaimer, the term of this patent is extended or adjusted under 35 U.S.C. 154(b) by 241 days.

(21) Appl. No.: 10/576,925

(22) PCT Filed: Sep. 27, 2004

(86) PCT No.: PCT/JP2004/014088
§ 371 (c)(1),
(2), (4) Date: Apr. 24, 2006

(87) PCT Pub. No.: WO2005/041373
PCT Pub. Date: May 6, 2005

(65) Prior Publication Data
US 2007/0091958 A1    Apr. 26, 2007

(51) Int. Cl.
*H01S 5/00* (2006.01)
(52) U.S. Cl. ............... 372/50.1; 372/50.12; 372/50.121
(58) Field of Classification Search ................ 372/50.1, 372/50.12, 50.121
See application file for complete search history.

(56) References Cited

U.S. PATENT DOCUMENTS

| | | | |
|---|---|---|---|
| 4,901,325 A | 2/1990 | Kato et al. | |
| 5,355,382 A | 10/1994 | Kovacs et al. | |
| 5,402,436 A * | 3/1995 | Paoli | 372/50.12 |
| 2002/0053872 A1 | 5/2002 | Yang et al. | |
| 2002/0142503 A1 | 10/2002 | Miyachi et al. | |
| 2005/0022697 A1* | 2/2005 | Benrashid et al. | 106/287.13 |

FOREIGN PATENT DOCUMENTS

| | | |
|---|---|---|
| EP | 1 126 526 A2 | 8/2001 |
| JP | 54-107689 A | 8/1979 |
| JP | 09-283838 A | 10/1997 |
| JP | 10-247648 A | 9/1998 |
| JP | 2000-252593 | 9/2000 |
| JP | 2000-252593 A | 9/2000 |
| JP | 2001-119104 A | 4/2001 |
| JP | 2001-230502 | 8/2001 |
| JP | 2003-152280 A | 5/2003 |

* cited by examiner

*Primary Examiner*—Dung T Nguyen
(74) *Attorney, Agent, or Firm*—Arent Fox LLP

(57) ABSTRACT

This invention provides a semiconductor laser device and method of manufacture with a small interval between light emitting points of laser lights. A first light emitting element having a semiconductor substrate and a laser oscillation section, and a second light emitting element having a laser oscillation section, are brought together with a ridged waveguide of the laser oscillation section facing the ridged waveguide of the laser oscillation section, and then bonded together by virtue of SOGs having a small thickness. A conductive wiring layer electrically connected with an ohmic electrode layer on the ridged waveguide, and a wiring layer electrically connected with an ohmic electrode layer on the ridged waveguide, are arranged to extend until the insulating layer on the semiconductor substrate. Further, the ohmic electrodes and are formed on the bottom surface of the semiconductor substrate and the top surface of the laser oscillation section, respectively.

14 Claims, 11 Drawing Sheets

SEMICONDUCTOR LASER DEVICE AND METHOD OF MANUFACTURING THE SAME

CROSS-REFERENCE TO RELATED APPLICATION

This application is a National Stage entry of International Application Number PCT/JP2004/1014088, filed Sep. 27, 2004. The disclosure of the prior application is hereby incorporated herein in its entirety by reference.

TECHNICAL FIELD

The present invention relates to a semiconductor laser device capable of emitting a plurality of laser lights having different wavelengths and a method of manufacturing the same.

BACKGROUND OF THE INVENTION

With the spreading of digital broadcast or broadband, there has been a situation in which a large amount of digital contents have arrived at each home and information recording is required to have a further higher density. With regard to optical disc storage system, recording density has been developed from 700 MB CD (Compact Disc) using a light beam having a wavelength of 780 nm to 4.7 GB DVD (Digital Versatile Disc) using a light beam having a wavelength of 650 nm. Furthermore, in recent years an optical disc system having a capacity of more than 20 GB has been realized by using a light beam having a wavelength of 405 nm.

With such a high density recording system, since it is necessary to provide a compatibility to DVD which has been spread widely, it is necessary for an optical pickup to mount a laser device capable of emitting a light beam having a wavelength of 650 nm.

As to an optical pickup capable of emitting a plurality of light beams having different wavelengths, it is required to use a two-wavelength integrated laser device so as to make the optical pickup compact in size and light in weight. However, with regard to GaN based semiconductor which realizes a laser having a wavelength around 405 nm as well as AlGaInP based semiconductor which realizes a laser having a wavelength around 650 nm, since their physical properties differ greatly from each other, it is impossible to realize a monolithic integration on the same substrate. To solve this problem, there have been suggested an improved two-wavelength integrated laser device based on a hybrid structure (patent document 1: Japanese Unexamined Patent Applicant Publication No. 2001-230502; patent document 2: Japanese Unexamined Patent Applicant Publication No. 2000-252593).

A two-wavelength integrated laser device disclosed in patent document 1 is formed by stacking and attaching a first light emitting element and a second light emitting element on to a support substrate (so called sub-mount), thereby realizing a semiconductor laser device having a hybrid structure. Here, the first light emitting element has a first substrate and can emit a laser light having a short wavelength (for example, around 405 nm), while the second light emitting element has a second substrate and can emit a laser light having a long wavelength (for example, around 650 nm).

In more detail, the first light emitting element is attached to the support substrate in a manner such that its light emitting portion is positioned on the first substrate's one side facing the support substrate, while the second light emitting element is attached to the first light emitting element in a manner such that its light emitting portion is positioned on the second substrate's one side facing the first light emitting element.

A semiconductor laser device having a hybrid structure disclosed in patent document 2 is formed by electrically bonding n-electrode and p-electrode of a second laser section top-electrode and n-electrode of a first laser section through a fused metal so as to form an arrangement not containing the substrate of the first laser section, thereby making it possible to emit a plurality of laser lights having different wavelengths by virtue of the first laser section and the second laser section.

DESCRIPTION OF THE INVENTION

Problem(s) to be Solved by the Invention

As described above, the semiconductor laser device disclosed in patent document 1 is formed by stacking and attaching a first light emitting element and a second light emitting element on to a support substrate. However, in order to make it possible to pour an electric current into an interface serving as bonding surface between the first light emitting element and the second light emitting element, it is extremely important to stack and thus attach chipped first and second light emitting elements on to the support substrate after the first and second light emitting elements have been manufactured as individual semiconductor chips.

When using a two-wavelength integrated laser device as a light source in an optical pickup for handling an optical disc, it is necessary to control an interval between two light emitting points with a high precision (±1 µm or less). Further, in performing an alignment when various elements are in the form of chips, it is difficult to accurately control an interval between two light emitting points and their light emitting directions. Moreover, since it is necessary to perform an alignment for each chip, it is difficult to ensure an acceptable productivity.

On the other hand, the semiconductor laser device disclosed in patent document 1 is formed in a manner such that the light emitting portion of the first light emitting element is attached closely to the support substrate, while the light emitting portion of the second light emitting element is attached closely to the first substrate provided in the first light emitting element.

However, the above-mentioned structure has been found to have the following problem. Namely, the first substrate which has a considerable thickness is interposed between the first light emitting element and the second light emitting element. As described in the foregoing patent document 1, since the first substrate usually has a thickness of about 100 µm, it is difficult to avoid an undesirably large interval between the light emitting portion (the position of a light emitting point) of the first light emitting element and the light emitting portion (the position of a light emitting point) of the second light emitting element.

For the reasons discussed above, when the foregoing semiconductor laser device is mounted on an optical pickup for information recording or information reproducing, once the light emitting position (the position of a light emitting point) of the first light emitting section is aligned with the optical axis of an optical system which forms the optical pickup, the light emitting position of the second light emitting section will greatly deviate from the optical axis of the optical system, hence undesirably causing an aberration.

In deed, the above-mentioned unacceptable influence due to such an optical axis deviation can be eliminated by adding an optical element such as a prism in the optical pickup, this will increase the number of parts and manufacturing cost.

In the semiconductor laser device disclosed in patent document 2, since p-electrode and n-electrode of the first laser section are electrically bonded to n-electrode and p-electrode of the second laser section, there is a relatively large parasitic capacitance due to a fused metal, resulting in a problem that a response characteristic at the time of driving each laser section will drop down. For example, when recording information in CD and DVD or the like, once the first laser section or the second laser section is driven by a pulse current, the response characteristic will decrease under an influence of the above-mentioned parasitic capacitance, making it difficult to perform a quick control.

Moreover, with the semiconductor laser device disclosed in patent document 2, since p-electrode and n-electrode of the first laser section are electrically bonded to n-electrode and p-electrode of the second laser section through a fused metal, once an electric power is supplied in a forward direction to the first laser section through the fused metal for the first laser section to emit a light, the second laser section will be in an inversed bias state. On the other hand, once the electric power is supplied in a forward direction to the second laser section through the fused metal for the second laser section to emit a light, the first laser section will be in an inversed bias state.

As a result, whenever one of the first laser section and the second laser section is caused to emit a light, the other of the first and second laser sections will be in an inversed bias state, causing a pressure proof and a leak current in an opposite direction.

The present invention has been accomplished in order to solve the above-discussed problems and it is an object of the invention to provide an improved semiconductor laser device which has excellent electrical properties and is capable of emitting a plurality of laser lights having different wavelengths. Another object of the present invention is to provide an improved method of manufacturing the semiconductor laser device.

A further object of the present invention is to provide a method of manufacturing in mass production scale semiconductor laser devices each of which is capable of emitting a plurality of laser lights having different wavelengths, and has a small interval between light emitting points, excellent electrical properties and a high mechanical precision.

Means for Solving the Problem(s)

An invention recited in claim 1 is a semiconductor laser device which emits a plurality of laser lights having different wavelengths. The device comprises: a first laser oscillation section laminated on a semiconductor substrate; and a second laser oscillation section which oscillates at a wavelength different from the first laser oscillation section. Specifically, the first laser oscillation section's one surface located away from the semiconductor substrate and the second laser oscillation section's one surface located lose to its light emitting portion are bonded together by virtue of insulating adhesive layers. The semiconductor laser device further comprises: first and second ohmic electrode layers formed on the surfaces of waveguides of the first and second laser oscillation sections; and first and second wiring layers formed between the first and second laser oscillation sections, electrically and individually connected with the first and second ohmic electrode layers.

An invention recited in claim 2 is a semiconductor laser device based on claim 1, in which the first laser oscillation section or the semiconductor substrate is partially protruding when viewed from the second laser oscillation section side, with the first and second wiring layers extending on the surface of the protruding portion.

An invention recited in claim 3 is a semiconductor laser device based on claim 1 or 2, in which the adhesive layers are SOG (spin on glass).

An invention recited in claim 4 is a semiconductor laser device based on any one of claims 1 to 3, in which an insulating layer consisting of a material different from the adhesive layers is formed between the first wiring layer and the first laser oscillation section expect an area of the ohmic electrode layer.

An invention recited in claim 5 is a semiconductor laser device based on any one of claims 1 to 4, in which the semiconductor substrate consists of III-V compound semiconductor; the first laser oscillation section includes III-V compound semiconductor or II-VI compound semiconductor containing arsenic (As), phosphorus (P) or antimony (Sb) as group V element; the second laser oscillation section includes nitride based III-V compound semiconductor containing nitrogen (N) as group V element.

An invention recited in claim 6 is a semiconductor laser device based on anyone of claims 1 to 4, in which the first laser oscillation section includes nitride based III-V compound semiconductor containing nitrogen (N) as group V element, the second laser oscillation section includes III-V compound semiconductor or II-VI compound semiconductor containing arsenic (As), phosphorus (P) or antimony (Sb) as group V element.

An invention recited in claim 7 is a method of manufacturing a semiconductor laser device which emits a plurality of laser lights having different wavelengths. This method comprises the steps of: forming a first film layer containing at least an active layer and waveguides on a semiconductor substrate to produce a first intermediate body; forming a second film layer containing at least an active layer and waveguides on a support substrate to produce a second intermediate body; causing the waveguides of the first and second intermediate bodies to face each other and bonding together the first and second intermediate bodies by virtue of insulating adhesive layers; and removing the support substrate to expose the second film layer.

An invention recited in claim 8 is a method of manufacturing a semiconductor laser device based on claim 7. In the step of producing the first intermediate body, first ohmic electrode layers along the waveguides of the first film layer, a first wiring layer electrically connected with the first ohmic electrode layers, first insulating adhesive layers covering predetermined areas including the waveguides, and a second wiring layer are formed and thus laminated on the first film layer's one surface having the waveguides. In the step of producing the second intermediate body, second ohmic electrode layers along the waveguides of the second film layer are formed on the second film layer's one surface having the waveguides, and second insulating adhesive layers are formed in areas not including the second ohmic electrode layers. In the step of fixing together the first and second intermediate bodies by virtue of insulating adhesive layers, the second wiring layer and the second ohmic electrode layers are electrically connected with each other so as to tightly bond together the first and second insulating adhesive layers, thereby fixing together the first and second intermediate bodies by virtue of the insulating adhesive layers.

An invention recited in claim 9 is a method of manufacturing a semiconductor laser device based on claim 7 or 8, in which the adhesive layers are SOG (spin on glass).

An invention recited in claim 10 is a method of manufacturing a semiconductor laser device based on any one of claims 7 to 9, in which the semiconductor substrate consists of III-V compound semiconductor; the first film layer includes III-V compound semiconductor or II-VI compound semiconductor containing arsenic (As), phosphorus (P) or antimony (Sb) as group V element; the second film layer includes nitride based III-V compound semiconductor containing nitrogen (N) as group V element.

An invention recited in claim 11 is a method of manufacturing a semiconductor laser device based on claim 10, in which the support substrate is a sapphire substrate or an AlN substrate; in the step of exposing the second film layer, a light is applied from the backside of the support substrate to an area adjacent to the junction between the support substrate and the second film layer, so as to heat and thus decompose the area near the junction.

An invention recited in claim 12 is a method of manufacturing a semiconductor laser device based on claim 11, in which the light has a wavelength of 360 nm or less.

An invention recited in claim 13 is a method of manufacturing a semiconductor laser device which emits a plurality of laser lights having different wavelengths. This method comprises the steps of: forming a first film layer containing at least an active layer and waveguides on a first semiconductor substrate to produce a first intermediate body; forming a second film layer containing at least an active layer and waveguides on a second semiconductor substrate to produce a second intermediate body; causing the waveguides of the first and second intermediate bodies to face each other and bonding together the first and second intermediate bodies by virtue of insulating adhesive layers; and removing the second semiconductor substrate to expose the second film layer.

An invention recited in claim 14 is a method of manufacturing a semiconductor laser device based on claim 13. In the step of producing the first intermediate body, first ohmic electrode layers along the waveguides of the first film layer, a first wiring layer electrically connected with the first ohmic electrode layers, and first adhesive layers are formed and thus laminated on the first film layer's one surface having the waveguides. In the step of producing the second intermediate body, second ohmic electrode layers along the waveguides of the second film layer, a second wiring layer electrically connected with the second ohmic electrode layers, and second adhesive layers are formed and thus laminated on the second film layer's one surface having the waveguides. In the step of fixing together the first and second intermediate bodies by virtue of the adhesive layers, the first and second adhesive layers are tightly bonded together so as to bond together the first and second intermediate bodies.

An invention recited in claim 15 is a method of manufacturing a semiconductor laser device based on claim 14, wherein in the step of producing the first intermediate body, insulating layers covering areas not including the first ohmic electrode layers and formed of a material different from the adhesive layers are formed on the first film layer's one surface having the waveguides, followed by forming, on the insulating layers, the first wiring layer electrically connected with the first ohmic electrode layers.

An invention recited in claim 16 is a method of manufacturing a semiconductor laser device based on claim 15, wherein subsequent to the step of removing the second semiconductor substrate to expose the second film layer, the second film layer and the adhesive layers are partially etched to partially expose the wiring layer and the insulating layer.

An invention recited in claim 17 is a method of manufacturing a semiconductor laser device based on any one of claims 13 to 16, in which adhesive layer is SOG (spin on glass).

An invention recited in claim 18 is a method of manufacturing a semiconductor laser device based on any one of claims 13 to 17, wherein the first semiconductor substrate consists of nitride based III-V compound semiconductor containing nitrogen (N) as group V element, the first film layer consists of nitride based III-V compound semiconductor containing nitrogen (N) as group V element, the second semiconductor substrate consists of III-V compound semiconductor, the second film layer includes III-V compound semiconductor or II-VI compound semiconductor containing arsenic (As), phosphorus (P) or antimony (Sb) as group V element.

BEST MODE OF CARRYING OUT THE INVENTION

Figure 1:
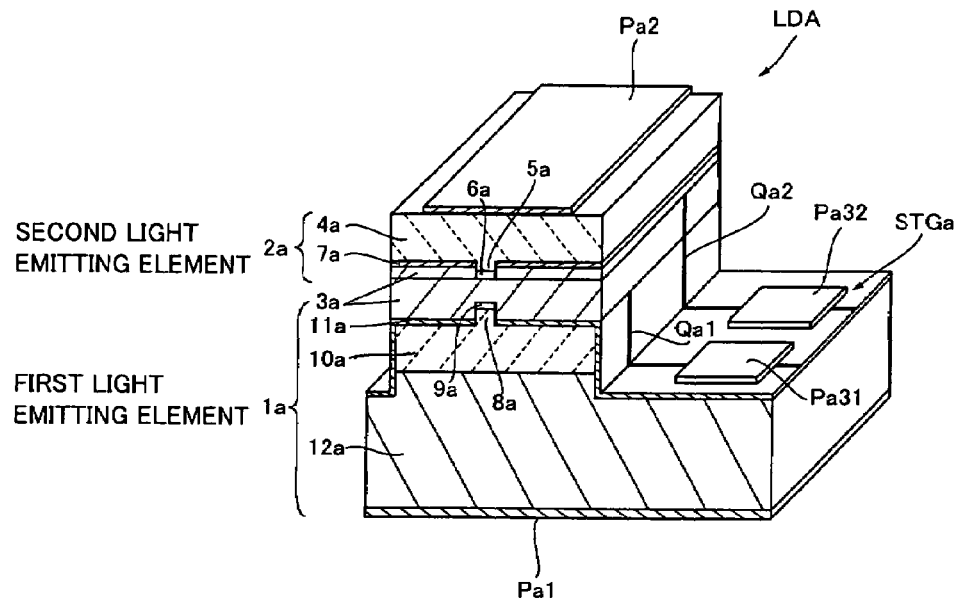
FIG. 1 provides views showing an outer structure and a longitudinal section of a semiconductor laser device formed according to a first embodiment of the present invention.
Figure 1:
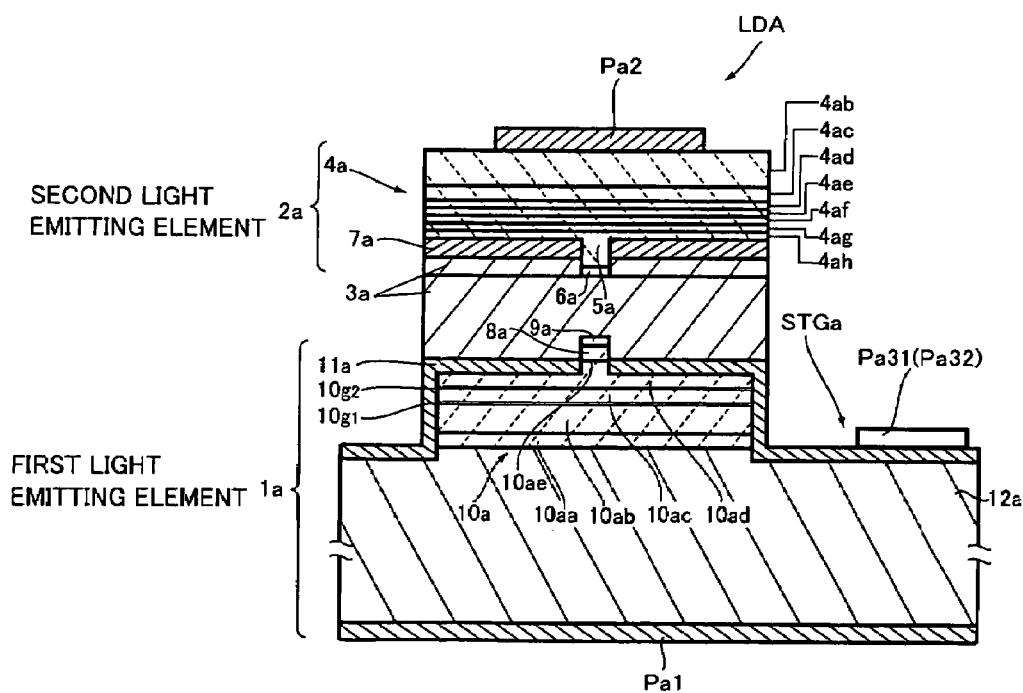
Figure 2:
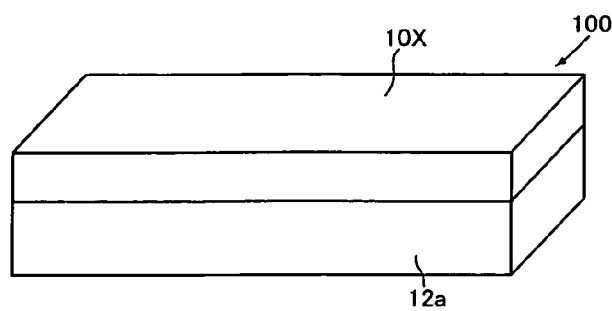
FIG. 2 provides perspective views schematically showing a process of manufacturing the semiconductor laser device shown in FIG. 1.
Figure 2:
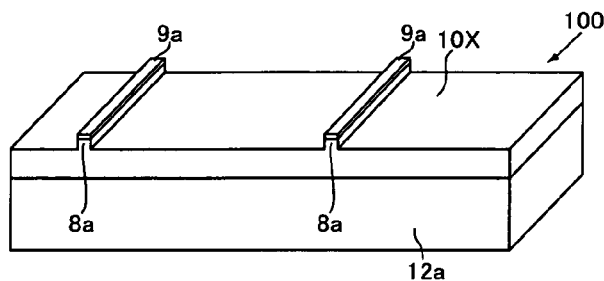
Figure 2:
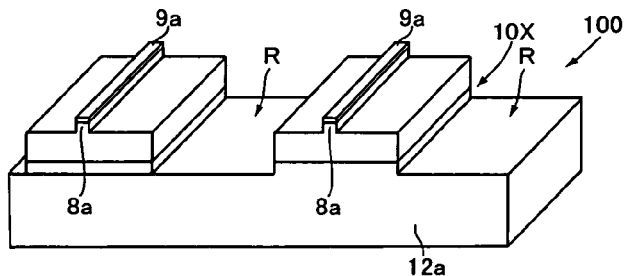
Figure 2:
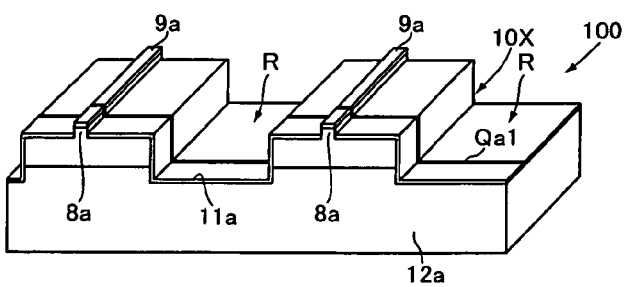
Figure 2:
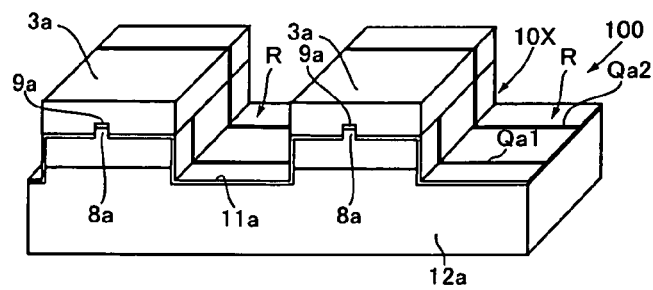
Figure 3:
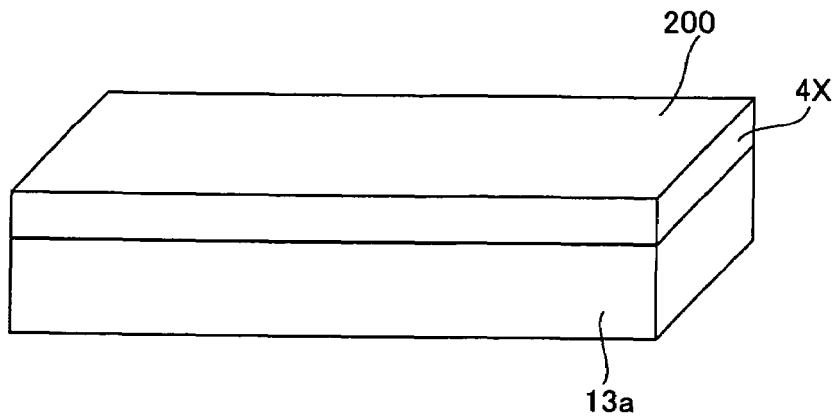
FIG. 3 provides further perspective views schematically showing a process of manufacturing the semiconductor laser device shown in FIG. 1.
Figure 3:
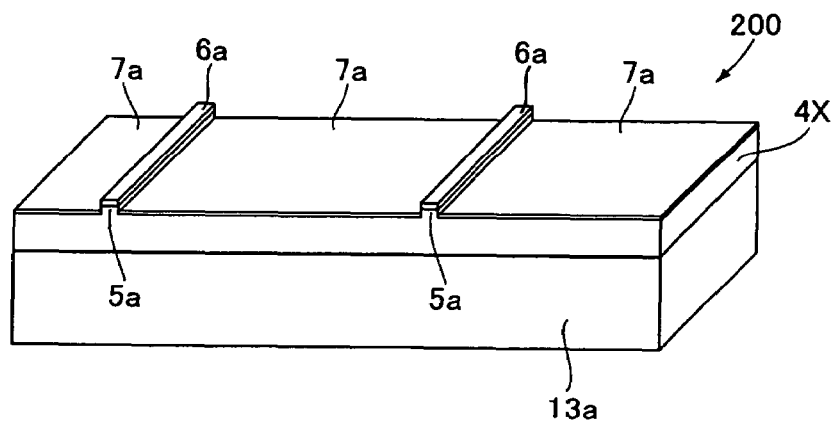
Figure 3:
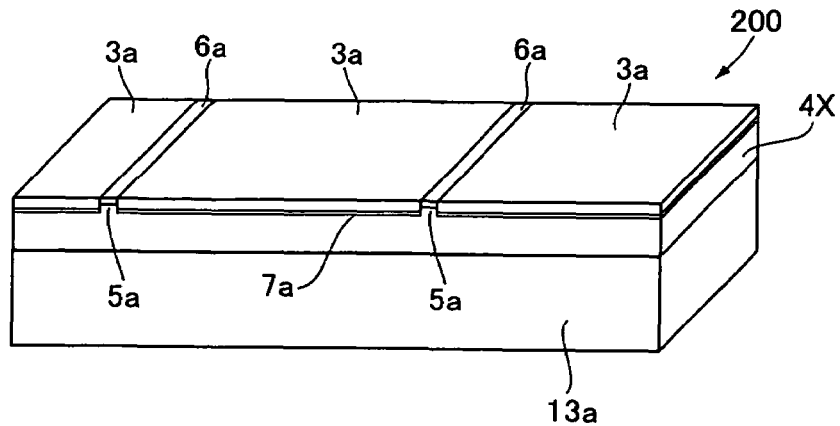

In the following, with reference to the accompanying drawings, description will be given to explain the first and second embodiments serving as the best mode for carrying out the present invention.

FIRST EMBODIMENT

A semiconductor laser device of the first embodiment will be described with reference to FIGS. 1 to 5.

In detail, FIG. 1(a) is a perspective view showing an outer structure of the semiconductor laser device LDA, FIG. 1(b) is a view showing a longitudinal section of the semiconductor laser device LDA illustrated in FIG. 1(a), and FIGS. 2 to 5 are perspective views schematically showing a process of manufacturing the semiconductor laser device LDA.

As shown in FIGS. 1(a) and 1(b), the semiconductor laser device LDA comprises a first light emitting element 1a including a semiconductor substrate 12a consisting of III-V compound semiconductor (for example, GaAs), an insulating SiO$_2$ based SOG (spin on glass) 3a, and a second light emitting element 2a. In fact, such a semiconductor laser device LDA is formed by integrally bonding together the first light emitting element 1a and the second light emitting element 2a by virtue of the SOG 3a.

Here, as compared with the second light emitting element 2a, the semiconductor substrate 12a occupies a much larger area, thus having a protruding portion STGa by virtue of a difference between the semiconductor substrate 12a and the second light emitting element 2a.

The first light emitting element 1a includes a laser oscillation section 10a having formed thereon a waveguide (in the present embodiment, it is a ridged waveguide) channel 8a, an ohmic electrode layer 9a formed on the ridged waveguide 8a, an insulating layer 11a covering an entire area of the laser oscillation section 10a and the protruding portion STGa except the ohmic electrode layer 9a, a stripe-shaped conductive wiring layer Qa1 electrically connected with the ohmic electrode layer 9a and extending along the protruding portion STGa, an electrode pad Pa31 electrically connected with the wiring layer Qa1 and mounted on the protruding portion STGa, and an ohmic electrode layer Pa1 formed on the backside of the semiconductor substrate 12a.

The laser oscillation section 10a is formed by a double hetero structure (DH) and a ridged waveguide 8a located on the SOG 3a side. The double hetero structure (DH) includes an active layer having a distorted quantum well structure consisting of III-V compound semiconductor (for example, AlGaInP based semiconductor) containing one of arsenic (As), phosphorus (P), and antimony (Sb) as group V element. The double hetero structure (DH) also includes two clad layers laminated together with the active layer interposed therebetween.

In this way, once a drive current is supplied between the ohmic electrode layer Pa1 and the electrode pad Pa31, such a drive current will flow into the ridged waveguide 8a through the wiring layer Qa1 and the ohmic electrode layer 9a, and further into the active layer in the laser oscillation section 10a along the ridged waveguide 8a, thereby emitting a light.

Further, a laser resonator is formed by virtue of cleavage surfaces (mirror surfaces) formed on both ends of the elongated ridged waveguide 8a. In this way, a light generated along the ridged waveguide 8a is reflected by the two cleavage surfaces (mirror surfaces) and repeatedly reciprocated through the active layer, and at the same time induces carrier recombination one after another so as to effect an induced emission, thereby emitting a laser light having a predetermined wavelength (for example, around 650 nm) from the cleavage surfaces.

The second light emitting element 2a includes a laser oscillation section 4a having formed thereon a waveguide (in the present embodiment, it is a ridged waveguide) 5a, an ohmic electrode layer 6a formed on the ridged waveguide 5a, an insulating layer 7a interposed between the laser oscillation section 4a and the SOG 3a except the ohmic electrode layer 6a, a stripe-shaped conductive wiring layer Qa2 electrically connected with the ohmic electrode layer 6a and extending along the protruding portion STGa, an electrode pad Pa32 electrically connected with the wiring layer Qa2 and mounted on the protruding portion STGa, and an ohmic electrode layer Pa2 formed on the top surface of the semiconductor substrate 4a.

Here, as shown in FIGS. 1(a) and 1(b), the SOG 3a is formed on the insulating layer 11a at a size which is almost the same as or slightly smaller than its surface facing the ridged waveguide 8a of the laser oscillation section 10a, while the laser oscillation section 4a is formed in a size which is almost the same as the SOG 3a.

The laser oscillation section 4a has a double hetero structure (DH) and a ridged waveguide 5a located on the SOG 3a side. The double hetero structure (DH) includes an active layer having a multiple quantum well structure consisting of a nitride based III-V compound semiconductor (for example, GaN based semiconductor) whose group V element consists of nitrogen (N). The double hetero structure (DH) also includes two clad layers laminated together with the active layer interposed therebetween.

In this way, once a drive current is supplied between the ohmic electrode layer Pa2 and the electrode pad Pa32, such a drive current will flow into the ridged waveguide 5a through the wiring layer Qa2 and the ohmic electrode layer 6a, and further into the active layer in the laser oscillation section 4a along the striped shape of the ridged waveguide 5a, thereby emitting a light.

Further, a laser resonator is formed by virtue of cleavage surfaces (mirror surfaces) formed on both ends of the elongated ridged waveguide 5a. In this way, a light generated along the striped shape of the ridged waveguide 5a is reflected by the two cleavage surfaces (mirror surfaces) and repeatedly reciprocated through the active layer, and at the same time induces carrier recombination one after another so as to effect an induced emission, thereby emitting a laser light having a predetermined wavelength (for example, around 405 nm) from the cleavage surfaces.

By virtue of the above-described structure, the semiconductor laser device LDA enables the first light emitting element 1a and the second light emitting element 2a to emit lights individually and respectively. Further, it is also possible for the first and second light emitting elements to emit lights simultaneously.

Next, description will be given to explain a process of manufacturing the semiconductor laser device LDA having the above-described structure, with reference to FIGS. 2 to 5.

At first, an intermediate body 100 for forming the first light emitting element 1a is manufactured at steps shown in FIGS. 2(a) to 2(e), and another intermediate body 200 for forming the second light emitting element 2a is manufactured at steps shown in FIGS. 3(a) to 3(c).

<A First Step for Manufacturing the Intermediate Body 100>

To manufacture the intermediate body 100, as shown in FIG. 2(a), MOCVD method or the like is employed to laminate a plurality of semiconductor films containing an AlGaInP based semiconductor and having different compositions and thicknesses on GaAs (001) substrate 12a, thereby forming an AlGaInP based film layer 10X including an active layer having a distorted quantum well structure and a clad layer.

In more detail, a plurality of layers 10aa-10ae shown in FIG. 1(b) are laminated to form the laser oscillation section 10a. In practice, a buffer layer 10aa consisting of n-type GaAs formed by doping silicon (Si) is at first formed on the GaAs substrate 12a at a thickness of about 0.5 μm, followed by laminating an n-type clad layer 10ab consisting of $Al_{0.35}Ga_{0.15}In_{0.5}P$ at a thickness of about 1.2 μm.

Next, a guide layer 10g1 consisting of AlGaInP is laminated at a thickness of 0.05 μm.

Subsequently, an active layer 10ac having a distorted quantum well structure consisting of GaInP and AlGaInP is laminated at a thickness of about several tens of nm, followed by laminating a guide layer 10g2 consisting of AlGaInP at a thickness of about 0.05 μm. Afterwards, p-type clad layer 10ad consisting of p-type $Al_{0.35}Ga_{0.15}In_{0.5}P$ formed by doping zinc (Zn) is laminated at a thickness of about 1.2 μm. Next, a current carrying layer 10ae consisting of p-type $Ga_{0.51}In_{0.49}P$ is laminated at a thickness of about 0.05 μm, followed by laminating p-side contact layer (not shown) consisting of p-type GaAs at a thickness of about 0.2 μm.

<A Second Step for Manufacturing the Intermediate Body 100>

Next, as shown in FIG. 2(b), a plurality of ridged waveguides 8a are formed in <110> direction on AlGaInP based film layer 10X, followed by forming therein ohmic electrode layers 9a.

Namely, a mask in conformity with the shape of two or more ridged waveguides 8a in <110> direction is formed on the foregoing p-side contact layer (not shown), thereby allowing the portions exposed from the mask to be wet-etched.

The etching is performed until the p-type clad layer 10ad has reached a thickness of 0.2 μm, thereby forming a plurality of ridged waveguides 8a. Then, the mask is removed and a vapor deposition is performed so as to form, on the ridged waveguides 8a, the ohmic electrode layers 9a consisting of chromium (Cr), gold (Au) or their alloy at a thickness of about 200 nm.

<A Third Step for Manufacturing the Intermediate Body 100>

Next, as shown in FIG. 2(c), the wet-etching is continued until several upper portions of the GaAs (001) substrate 12a are removed, thereby forming a plurality of grooves R arranged in <110> direction and having a depth of 5 μm. In fact, at this step, the AlGaInP based film layer 10X is also etched in a manner such that predetermined areas containing ridged waveguides 8a are not etched and thus kept as such.

In more detail, a mask is formed to cover the predetermined areas containing the ridged waveguides 8a, thereby allowing the portions exposed from the mask to be wet-etched using an etching liquid having a ratio of sulfuric acid:hydrogen peroxide water:water of 4:1:1.

<A Fourth Step for Manufacturing the Intermediate Body 100>

Then, the mask is removed and an insulating layer 11a consisting of $ZrO_2$ is formed on the surface of AlGaInP based film layer 10X except ohmic electrode layers 9a as well as in the grooves R, in a manner shown in FIG. 2(d). Subsequently, vapor deposition is performed to form a wiring layer Qa1 consisting of Au and having a narrow width on the ohmic electrode layers 9a as well as on the insulating layer 11a, in a manner such that the formed wiring layer Qa1 is substantially orthogonal to the longitudinal direction of the ridged waveguides 8a, thereby allowing the wiring layer Qa1 and the ohmic electrode layers 9a to be electrically connected with each other and allowing the wiring layer Qa1 itself to extend in the grooves.

<A Fifth Step for Manufacturing the Intermediate Body 100>

Next, as shown in FIG. 2(e), SOG 3a is formed to cover the upper surface of the ohmic electrode layers 9a as well as the upper surface of the insulating layer 11a except the portions extending in the grooves R, thereby forming on the insulating layer 11a a plurality of SOGs 3a each having a size which is almost the same as or slightly smaller than the laser oscillation section 10a shown in FIG. 1(b).

Then, vapor deposition is performed to form a wiring layer Qa2 consisting of Au and having a narrow width on the SOGs 3a as well as on the insulating layer 11a, in a manner such that the formed wiring layer Qa2 is substantially parallel to the wiring layer Qa1, thereby allowing the formed wiring layer Qa2 to extend over the upper surfaces and the side faces of the SOGs 3a, as well as over the insulating layer 11a and in the grooves R.

In this way, the above steps 1 to 4 can be carried out to manufacture a final intermediate body 100 which can produce a plurality of first light emitting elements 1a.

<A First Step for Manufacturing the Intermediate Body 200>

The intermediate body 200 is formed in a procedure which can be described as follows. At first, as shown in FIG. 3(a), MOCVD method or the like is employed and sapphire (0001) substrate 13a is used as a support substrate to form and thus laminate, on the sapphire (0001) substrate 13a, a plurality of semiconductor films consisting of GaN based semiconductor and having different compositions and different thicknesses, thereby forming a GaN based semiconductor including an active layer having the above-mentioned multiple quantum well structure and a clad layer.

In more detail, a plurality of layers 4ab-4ah shown in FIG. 1(b) are laminated one above another to form the laser oscillation section 4a. In practice, at first a buffer layer (not shown) consisting of GaN or AlN is formed at a thickness of about several tens of nm on the sapphire (0001) substrate 13a, followed by laminating thereon a base layer 4ab consisting of n-type GaN formed by doping silicon (Si), at a thickness of about 5-15 μm. Next, an n-type clad layer 4ac consisting of n-type $Al_{0.08}Ga_{0.92}N$ is laminated at a thickness of about 0.8 μm, followed by laminating a guide layer 4ad consisting of n-type GaN at a thickness of about 0.2 μm.

Next, the active layer 4ae is laminated at a thickness of about several tens of nm, which has a multiple quantum well structure including a well layer and a barrier layer having different compositions, with the well layer consisting of $In_xGa_{1-x}N$ (0≦x), for example, $In_{0.08}Ga_{0.92}N$, and $In_{0.01}Ga_{0.99}N$.

Next, an electronic barrier layer 4af consisting of $Al_{0.2}Ga_{0.8}N$ is laminated at a thickness of about 0.02 μm, followed by laminating p-type guide layer 4ag consisting of p-type GaN formed by doping magnesium (Mg), at a thickness of about 0.2 μm.

Next, p-type clad layer 4ah consisting of p-type $Al_{0.08}Ga_{0.92}N$ is laminated at a thickness of about 0.4 μm, followed by laminating p-side contact layer (not shown) consisting of p-type GaN at a thickness of about 0.1 μm.

<A Second Step for Manufacturing the Intermediate Body 200>

Next, as shown in FIG. 3(b), a plurality of ridged waveguides 5a in <1-100> direction are formed on the GaN based film layer 4X, followed by forming thereon ohmic electrode layers 6a.

Namely, a mask in conformity with the shape of the plurality of ridged waveguides 5a along <1-100> direction is formed on the foregoing p-side contact layer (not shown), followed by etching the portions exposed from the mask using a reactive ion etching (RIE) process. Then, p-type guide layer 4ag is etched until its thickness becomes about 0.05 μm, thereby forming a plurality of stripe-shaped ridged waveguides 5a.

Next, the mask is removed and vapor deposition is performed to form ohmic electrode layers 6a consisting of Pd, Au or their alloy on the tops of the ridged waveguides 5a, followed by laminating insulating layers 7a on areas excluding the ohmic electrode layers 6a.

<A Third Step for Manufacturing the Intermediate Body 200>

Next, as shown in FIG. 3(c), SOGs 3a are formed on the top surface of the insulating layers 7a to expose the ohmic electrode layers 6a, thereby finally obtaining an intermediate body 200 capable of producing a plurality of second light emitting elements 2a.

<A First Step for Manufacturing a Semiconductor Laser Device LDA>

Figure 4:
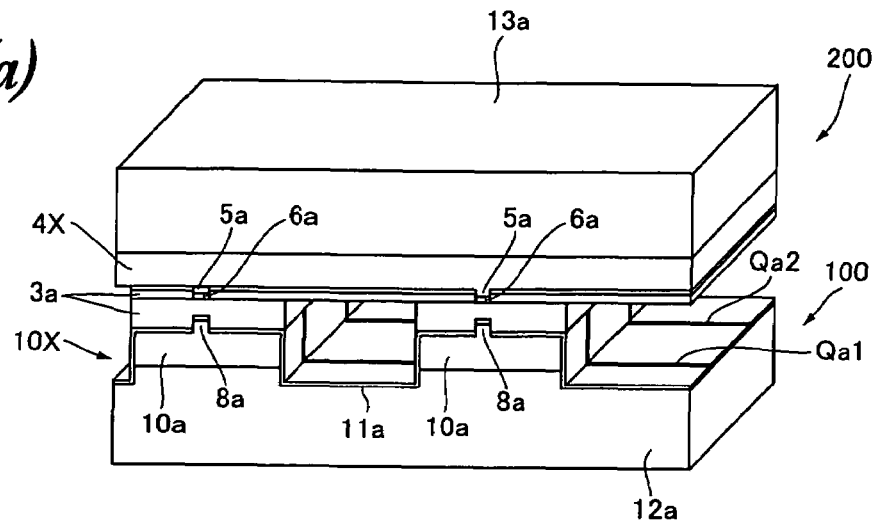
FIG. 4 provides further perspective views schematically showing a process of manufacturing the semiconductor laser device shown in FIG. 1.
Figure 4:
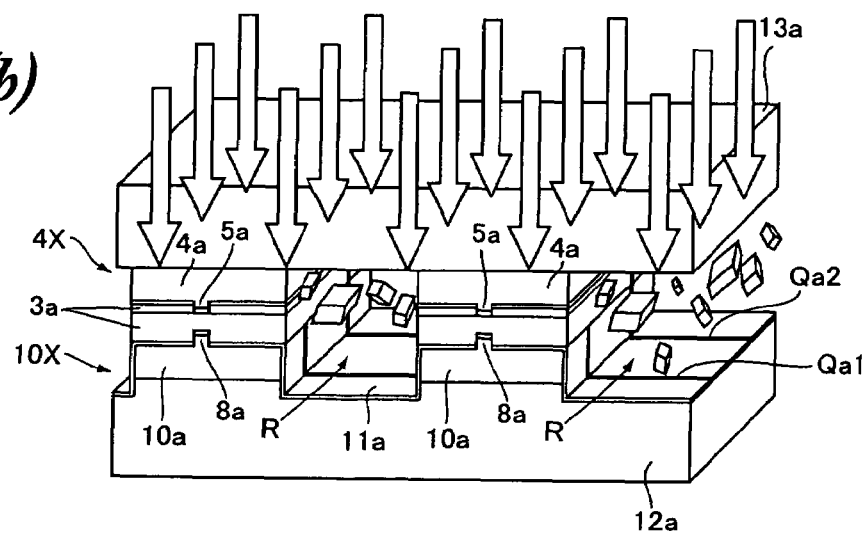
Figure 4:
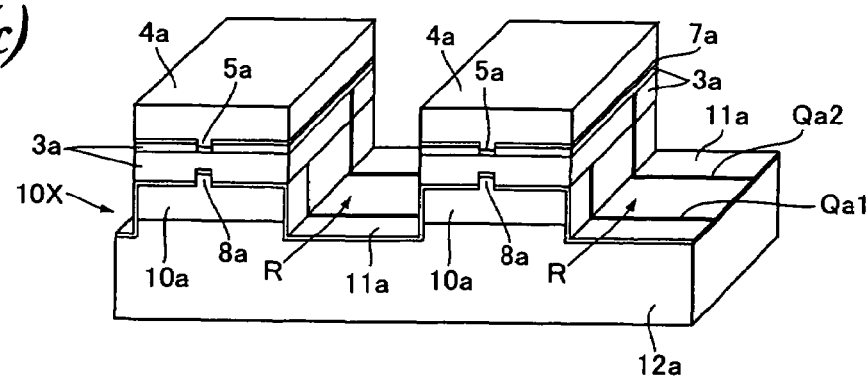
Figure 5:
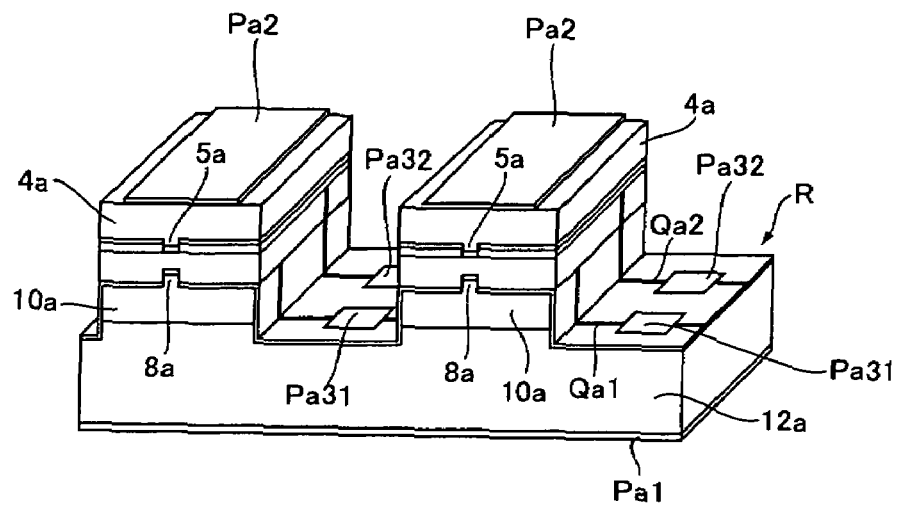
FIG. 5 provides further perspective views schematically showing a process of manufacturing the semiconductor laser device shown in FIG. 1.
Figure 5:
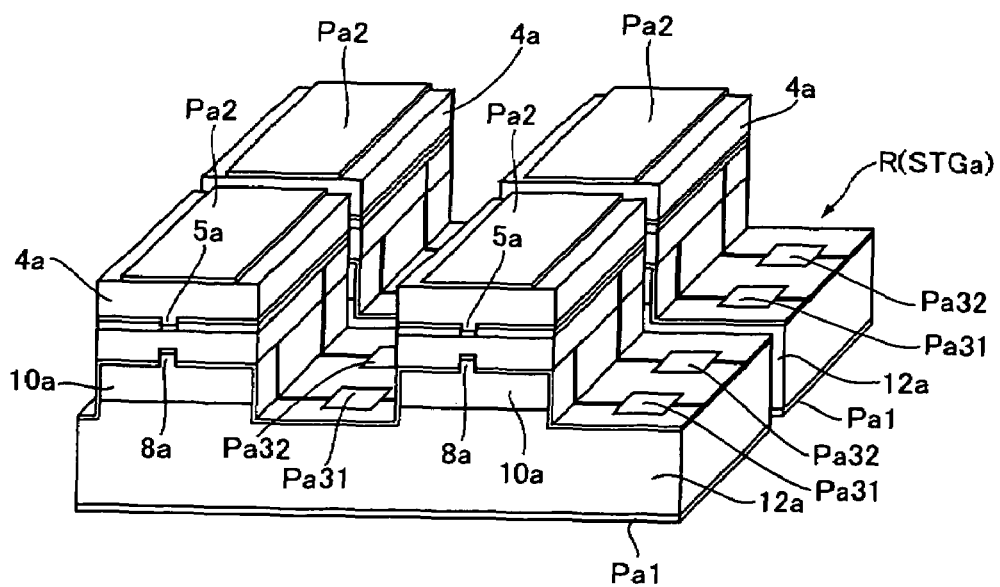

Next, steps shown in FIGS. 4 and 5 are carried out to manufacture a semiconductor laser device LDA from the intermediate bodies 100,200 produced above.

At first, as shown in FIG. 4(a), the SOGs 3a of the intermediate body 100 and the SOGs 3a of the intermediate body 200 are tightly bonded to each other in a manner such that the ridged waveguides 8a of the intermediate body 100 and the ridged waveguides 5a of the intermediate body 200, finally produced in the steps shown in FIG. 2(e) and FIG. 3(c), are caused to face each other. Then, the cleavage surface (110) of AlGaInP based film layer 10X and the cleavage surface (1-100) of GaN based film layer 4X are aligned with each other.

Furthermore, under the condition in which the SOGs 3a have been tightly bonded together, a heating process is performed at a temperature of about 550° C. to make the SOGs 3a of the intermediate body 100 and the SOGs 3a of the intermediate body 200 integral with each other. Further, the wiring layer Qa2 and the ohmic electrode layers 6a on the laser oscillation section 4a side are electrically connected to each other, with the wiring layer Qa2 on the ohmic electrode layer 6a side berried into the SOG3a.

<A Second Step for Manufacturing the Semiconductor Laser Device LDA>

Next, as shown in FIG. 4(b), a laser light having a wavelength of 360 nm or less, preferably a laser light which is a four-times wave (wavelength: 266 nm) of YAG laser is converged by a predetermined converging lens into a high energy light, to irradiate from the backside of the sapphire substrate 13a in a manner represented by a plurality of arrows shown in FIG. 4(b).

Once the high energy light is applied from the backside of the sapphire substrate 13a, almost the entire amount of the laser light having the wavelength of 226 nm will penetrate through the sapphire substrate 13a without being absorbed except an extremely small amount which is absorbed by GaN at an extremely small penetration depth. Further, since a considerable lattice mismatching occurs between the sapphire substrate 13a and GaN, an extremely large amount of crystal defects will exist in GaN near their junctions. For this reason, almost the entire amount of the absorbed light will be converted into heat, while areas near the junctions will be heated to an elevated temperature, with GaN decomposed into metal gallium and nitrogen gas.

At this time, since the groves R are existing, part of the GaN based film layer 4X facing the grooves R will fall down, thereby forming a plurality of laser oscillation sections 4a separated from each other with the grooves R acting as boundaries.

Here, the laser oscillation sections 4a (namely, the remaining GaN based film layer 4X) and the sapphire substrate 13a are in a weakly combined state based on metal gallium. Subsequently, the entire block is heated at a temperature of 40° C. which is higher than the melting point of gallium, so that sapphire substrate 13a can be removed from the laser oscillation sections 4a.

<A Third Step for Manufacturing the Semiconductor Laser Device LDA>

After the removal of the sapphire substrate 13a, a plurality of laser oscillation sections 4a separated from each other with the grooves R acting as boundaries, can be kept adhered to the AlGaInP based film layer 10X through the SOGs 3a, thereby exposing the insulating layer 11a and the wiring layers Qa1, Qa2 formed in the grooves on the AlGaInP based film layer 10X side.

Subsequently, an ultrasonic cleaning is performed in an amount of pure water so as to move the a fore-mentioned fallen fragments, followed by dipping the block in a diluted hydrochloric acid, thereby removing the metal gallium remaining in the exposed surfaces of the laser oscillation sections 4a.

<A Fourth Step for Manufacturing the Semiconductor Laser Device LDA>

Then, as shown in FIG. 5(a), vapor deposition or the like is performed to form ohmic electrodes Pa2 consisting of titanium (Ti), Au or their alloy on an exposed surface (n-type GaN surface) of each laser oscillation section 4a, and to form an ohmic electrode Pa1 consisting of an AuGe alloy (an alloy of gold and germanium) on the bottom surface of n-type GaAs substrate 12a. Meanwhile, vapor deposition or the like is performed to form metal electrode pads Pa31, Pa32 electrically and independently connected with the wiring layers Qa1, Qa2 extending in the grooves R.

<A Fifth Step for Manufacturing the Semiconductor Laser Device LDA>

Next, as shown in FIG. 5(b), a cleaving is performed along (1-100) plane which is a cleavage plane of GaN based film layer 4X, thereby forming desired laser resonators.

Furthermore, a secondary cleaving is performed in a direction perpendicular to the main surfaces of the laser resonators, thereby completing the manufacturing of the semiconductor laser devices LDA each including the first and second light emitting elements 1a and 2a shown in FIG. 1(a), with grooves R becoming projected exposed portions.

According to the above-described semiconductor laser device LDA, since it is possible to fix together the laser oscillation sections 4a and 10a by virtue of thin SOGs 3a, it is possible to reduce an interval between the light emitting points on the laser oscillation sections 4a and 10a. In other words, since an arrangement is formed in which the laser oscillation sections 4a and 10a are fixed together by virtue of thin SOGs 3a, it is possible to reduce an interval between the active layer of the laser oscillation section 4a and the active layer of the laser oscillation section 10a, thereby making it possible to shorten an interval between the light emitting point located in the active layer of the laser oscillation section 4a and the light emitting point located in the active layer of the laser oscillation section 10a.

Moreover, as shown in FIGS. 1(a) and 1(b), since a part of n-type GaAs substrate 12a projects beyond the laser oscillation sections 4a and 10a due to the presence of the grooves R, and since the wiring layers Qa1 and Qa2 are exposed on the upper surface of the projected portion through the insulating layer 11a, it is easy to ensure a desired wiring for supplying drive current.

Moreover, since the ohmic electrode layers 6a and 9a on the p-type semiconductor side are formed only on the ridged waveguides 5a and 8a, it is possible to ensure a small parasitic capacitance, thereby improving the response characteristic of the laser oscillation sections 4a and 10a, i.e., a high frequency response characteristic of the drive current.

Moreover, as described above, since the wiring layer Qa1 is electrically connected to the ohmic electrode layer 6a through the SOG 3a and the insulating layer 11a, and since the wiring layer Qa2 is electrically connected to the ohmic electrode layer 9a through the SOG 3a, it is possible to obtain the following advantages. Namely, once the drive current is supplied between the ohmic electrode Pa1 and the electrode pad Pa31, the first light emitting element 1a will emit a light. Similarly, once the drive current is supplied between the ohmic electrode Pa2 and the electrode pad Pa32, the second light emitting element 2a will emit a light. In fact, these light emissions are performed respectively and individually. On the other hand, it is also possible for the first and second light emitting elements 1a and 2a to emit light simultaneously.

Further, even when only one of the first and second light emitting elements 1a and 2a is caused to emit a light, the other of the first and second light emitting elements 1a and 2a will not be in an inverse bias state.

Moreover, if such semiconductor laser device LDA is installed in an optical pickup which records information on or reproduces information from CD, DVD or other storage medium, the above-mentioned reduced interval between two light emitting points makes it possible for the respective light emitting points on the first and second light emitting elements 1a and 2a to be located adjacent to the optical axis of the optical pickup, thereby greatly inhibiting the occurrence of an aberration or the like.

Moreover, according to the manufacturing method of the present embodiment, the intermediate bodies 100,200 capable of producing a plurality of first and second light emitting elements 1a and 2a are fixed together by SOGs 3a so as to form an integral block which is then divided into a plurality of semiconductor laser devices LDA by cleaving, scribing or the like. As a result, it is possible to realize an optimum control of an interval between two light emitting points of the two light emitting elements 1a and 2a in only one operation when fixing together the intermediate bodies 100 and 200, as well as to effect a highly accurate positioning. For this reason, it is possible to realize a simplified manufacturing process.

In this way, according to the present embodiment, it is possible to provide an improved semiconductor laser device LDA capable of emitting a plurality of laser lights having different wavelengths, having an excellent electrical property as well as a high mechanical precision. Further, it is also possible to provide an improved manufacturing method capable of manufacturing the above-described semiconductor laser device LDA with an adequate mass-production ability.

The above description has been given to explain an example in which the laser oscillation section 10a serving as main body of the first light emitting element 1a is formed by an III-V compound semiconductor containing arsenic (As), phosphorus (P), or antimony (Sb) as group V element. However, it is also possible for the laser oscillation section 10a to be formed by II-VI compound semiconductor.

Moreover, it is also possible for the insulating layers 7a and 11a to be formed by an insulating material such as $SiO_2$, $ZrO_2$, and AlN.

In addition, a substrate for forming GaN based semiconductor can be formed by using AlN and AlGaN.

In the above-described embodiment, the waveguides 5a and 8a for receiving a drive current are formed as ridged waveguides. However, the present invention should not be limited as such. In fact, it is also possible to adopt some other structures. Besides, it is also possible to omit the foregoing insulating layer 7a.

Modified Embodiment

Next, description will be given to explain a modified embodiment in relation to the above-described first embodiment, with reference to FIGS. 6(a) to 6(c). However, in FIGS. 6(a) to 6(c), elements which are identical with or corresponding to those of the semiconductor laser device LDA shown in FIGS. 1 to 5 will be represented by the same reference numerals.

Figure 6:
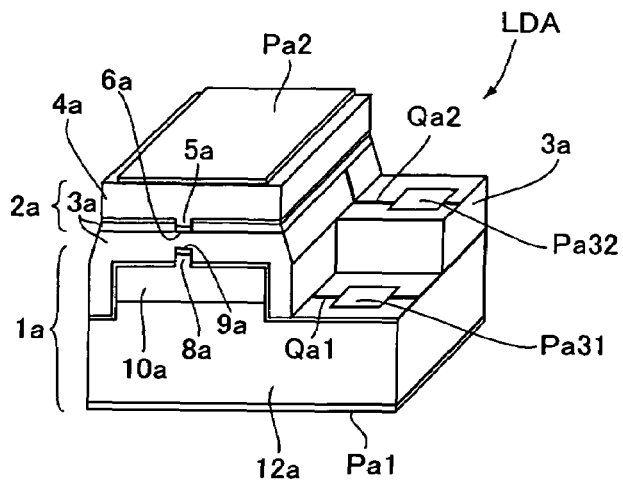
FIG. 6 provides perspective views showing a modified structure of a semiconductor laser device formed according to the first embodiment of the present invention and a process of manufacturing the same.
Figure 6:
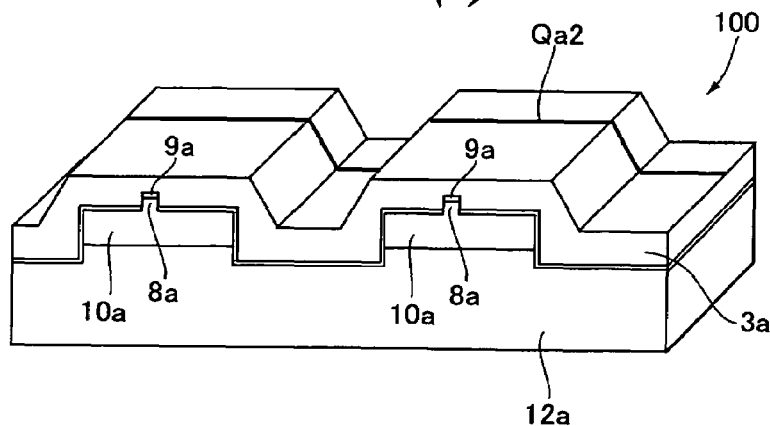
Figure 6:
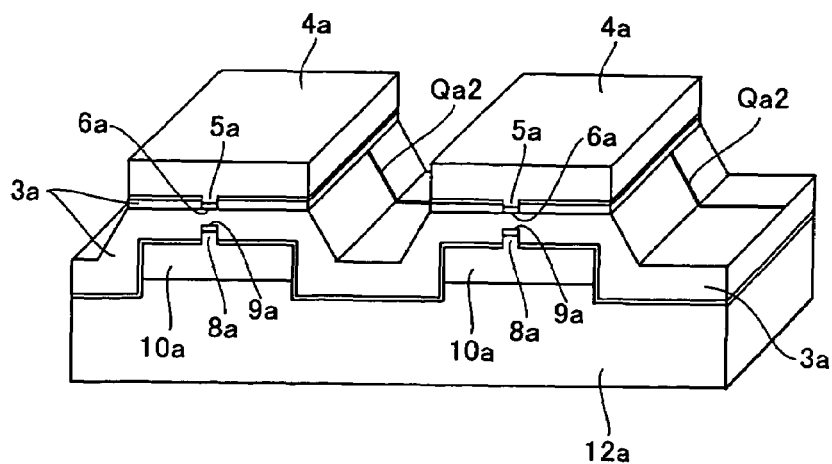

FIG. 6(a) is a perspective view corresponding to FIG. 1(a), showing an external structure of a semiconductor laser device LDA formed according to the present modified embodiment.

FIGS. 6(b) and 6(c) are perspective views schematically showing a process of manufacturing the semiconductor laser device LDA according to the present modified embodiment. In fact, FIG. 6(b) corresponds to FIG. 2(e) and FIG. 6(c) corresponds to FIG. 4(c).

At first, description will be given to explain a difference in structure between the semiconductor laser device LDA of this modified embodiment and the semiconductor laser device LDA shown in FIG. 1(a). Namely, in the semiconductor laser device LDA shown in FIG. 1(a), the wiring layers Qa1, Qa2 and the electrode pads Pa31 and Pa32 are formed on the insulating layer 11a of the projected portion STGa and located in the same plane.

On the other hand, in the semiconductor laser device LDA of this modified embodiment, one wiring layer Qa1 and one electrode pad Pa31 are formed through the insulating layer 11a on the semiconductor substrate 12a of the first light emitting element 1a, while the other wiring layer Qa2 and the other electrode Pa32 are formed on the surface of the trapezoid SOG 3a formed on the semiconductor substrate 12a and the insulating layer 11a.

The semiconductor laser device LDA of this modified embodiment can be manufactured in the following process which will be described below.

At first, an intermediate body 100 is produced in the manufacturing process described with reference to FIGS. 2(a) to 2(e), while an intermediate body 200 is produced in the manufacturing process described with reference to FIGS. 3(a) to 3(c).

However, with the semiconductor laser device LDA shown in FIG. 1(a), at a step (the fifth step for manufacturing the intermediate body 100) shown in FIG. 2(e), SOG 3a is formed only on the upper surface of AlGaInP based film layer 10X except the grooves R, followed by forming the wiring layer Qa2, thereby producing a final intermediate body 100. On the other hand, in the semiconductor laser device LDA formed according to this modified embodiment shown in FIG. 6(b), an entire area including grooves R is covered by SOG 3a. Then, the wiring layer Qa2 is formed on the surface of SOG 3a, thereby producing a final intermediate body 100.

Then, in the same steps as shown in FIGS. 4(a) and 4(b), the intermediate body 100 shown in FIG. 6(b) and the intermediate body 200 shown in FIG. 3(c) are fixedly bonded together through the SOG 3a. Afterwards, 4-time wave (wavelength: 266 nm) of YAG laser is converged by a predetermined converging lens into a high energy light which irradiates from the backside of the sapphire substrate 13a. As a result, GaN near the interface with the sapphire substrate 13a in the intermediate body 200 is decomposed into metal gallium and nitrogen gas. Subsequently, sapphire substrate 13a is removed.

In this way, different from the semiconductor laser device LDA shown in FIG. 1(a) whose intermediate body with its sapphire substrate 13a removed has a structure shown in FIG. 4(c), the semiconductor laser device LDA according to this modified embodiment is formed in a manner such that its intermediate body with its sapphire substrate 13a removed has a structure in which the SOG 3a and the wiring layer Qa2 located in the grooves R are exposed, as shown in FIG. 6(c).

Then, the SOG 3a located in the grooves R is etched except some predetermined areas in which the wiring layer Qa2 is formed, thereby exposing the wiring layer Qa1.

Afterwards, in the same steps as shown in FIGS. 5(a) and 5(b), a predetermined cleaving operation is performed, thereby completing the semiconductor laser device LDA of this modified embodiment shown in FIG. 6(a).

With the use of the semiconductor laser device LDA according to this modified embodiment, it is possible to obtain the same effects as obtainable from the semiconductor laser device LDA shown in FIG. 1(a).

SECOND EMBODIMENT

Next, description will be given to explain a semiconductor laser device LDB formed according to a second embodiment of the present invention, with reference to FIGS. 7 to 11.

Figure 7:
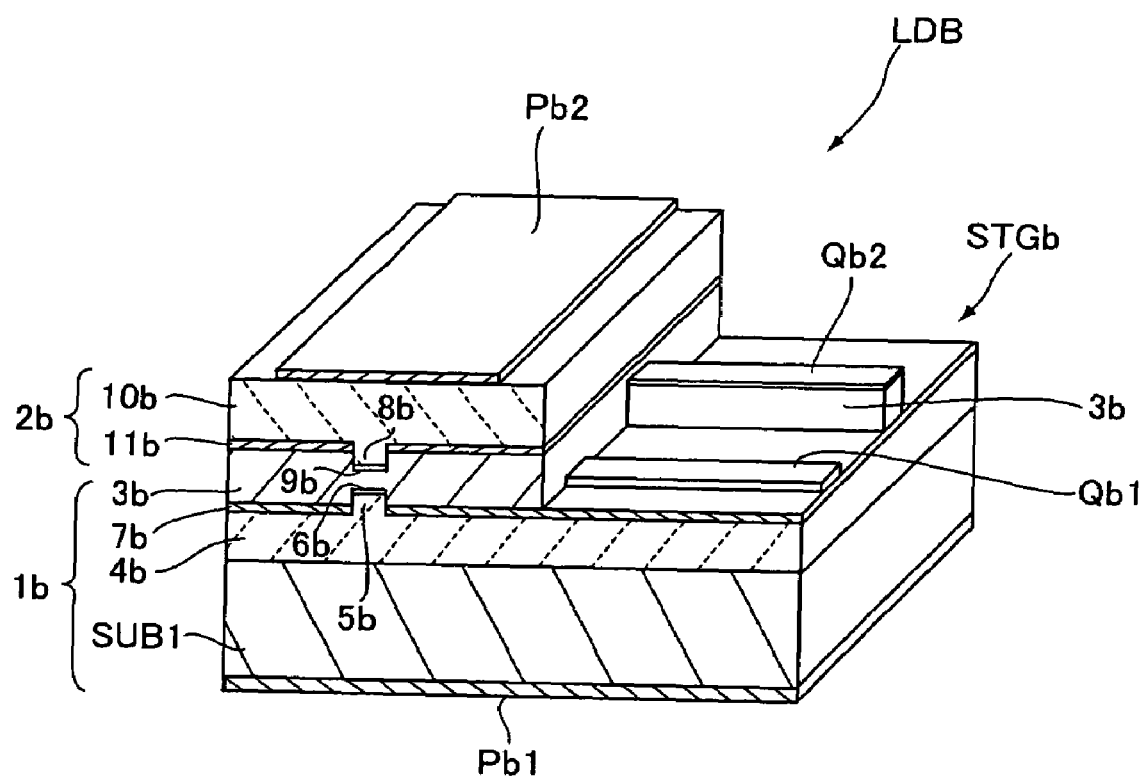
FIG. 7 is a view showing an outer structure of a semiconductor laser device formed according to a second embodiment of the present invention.
Figure 8:
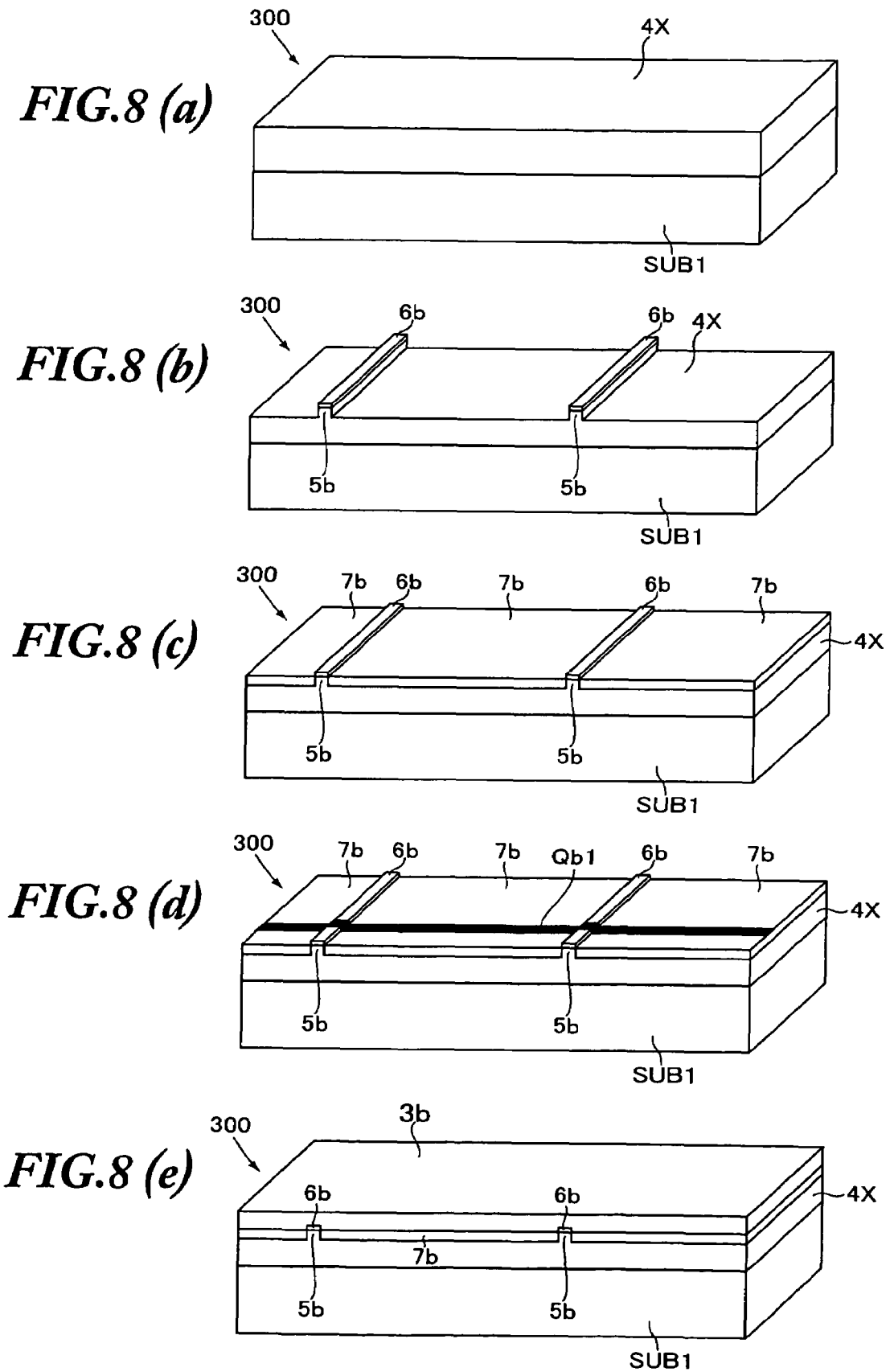
FIG. 8 provides perspective views schematically showing a process of manufacturing the semiconductor laser device shown in FIG. 7.
Figure 9:
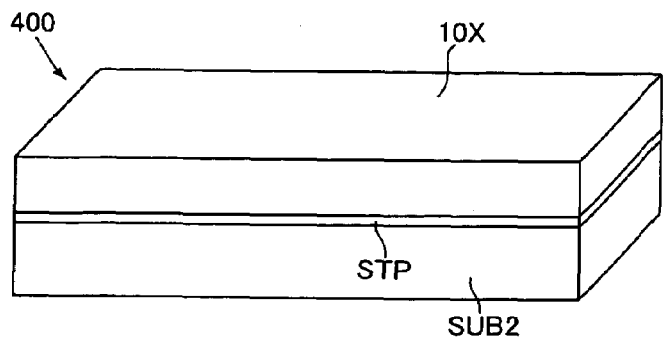
FIG. 9 provides further perspective views schematically showing a process of manufacturing the semiconductor laser device shown in FIG. 7.
Figure 9:
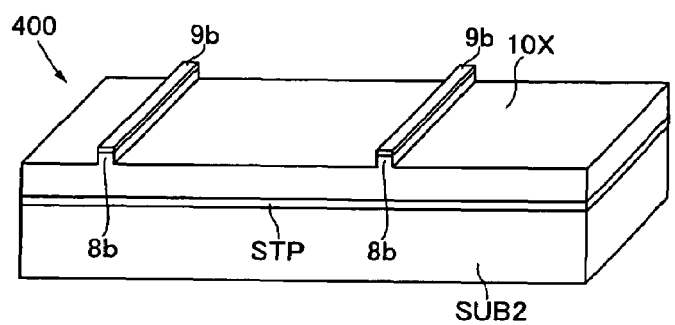
Figure 9:
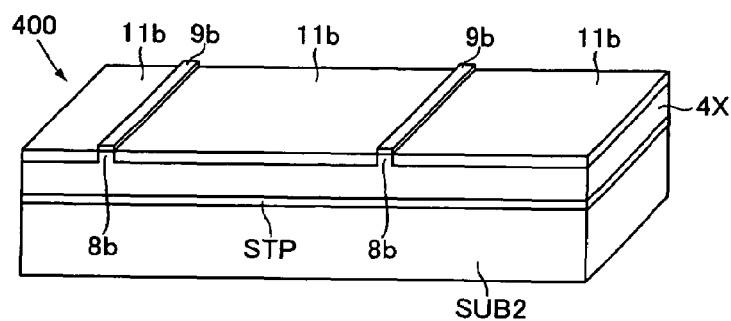
Figure 9:
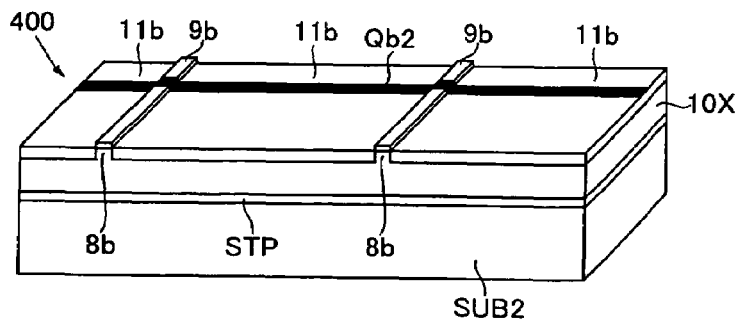
Figure 9:
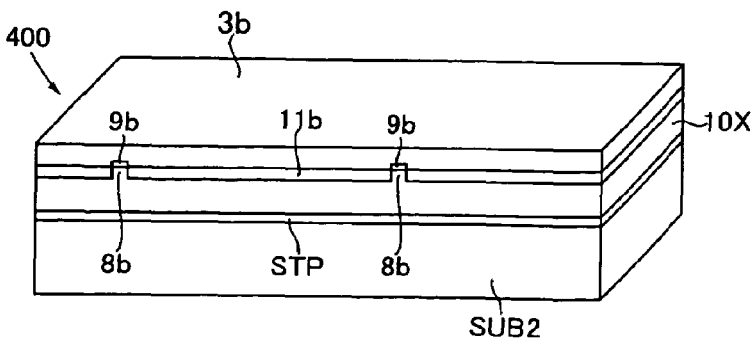

FIG. 7 is a perspective view showing an external structure of the semiconductor laser device LDB, FIGS. 8 to 11 are perspective views schematically showing a process of manufacturing the semiconductor laser device LDB.

As shown in FIG. 7, this semiconductor laser device LDB comprises a first light emitting element 1b capable of emitting a laser light having a predetermined wavelength, and a second light emitting element 2b capable of emitting a laser light having a longer wavelength (for example, 405 nm) than the first light emitting element, with the first light emitting element 1b and the second light emitting element 2b integrally bonded together by virtue of SiO$_2$ based SOG (spin on glass) 3b, thereby producing the semiconductor laser device LDB.

Here, as compared with an area occupied by the second light emitting element 2b, an area occupied by the semiconductor substrate SUB1 is relatively large. In this way, a projected portion STGb of the semiconductor substrate SUB1 is thus formed by virtue of an area difference between the second light emitting element 2b and the semiconductor substrate SUB1.

The first light emitting element 1b comprises a semiconductor substrate SUB1 formed by III-V compound semiconductor (GaN based semiconductor) whose group V element consists of nitrogen (N), a first laser oscillation section 4b having formed thereon a waveguide (which is a stripe-shaped ridged waveguide) and capable of emitting a laser light having the foregoing wavelength, an insulating layer 7b interposed between the laser oscillation section 4b and the SOG 3b except the ohmic electrode layer 6b, a stripe-shaped conductive wiring layer Qb1 electrically connected with the ohmic electrode layer 6b and extending along the projected portion STGb, and an ohmic electrode Pb1 formed on the bottom surface of the semiconductor substrate SUB1.

Here, the laser oscillation section 4b is formed by a double hetero structure (DH) and a ridged waveguide 5b located on the SOG 3a side. The double hetero structure (DH) includes an active layer having a multiple quantum well structure consisting of a nitride based III-V compound semiconductor (for example, GaN based semiconductor) whose group V element consists of nitrogen (N). The double hetero structure (DH) also includes two clad layers laminated together with the active layer interposed therebetween.

In this way, once a drive current is supplied between the exposed wiring layer Qb1 and the ohmic electrode layer Pb1, such a drive current will flow into the ridged waveguide 5b through the ohmic electrode layer 6b, and further into the active layer in the laser oscillation section 4b along the striped shape of the ridged waveguide 5b, thereby emitting a light.

Further, a laser resonator is formed by virtue of cleavage surfaces (mirror surfaces) formed on both ends of the elongated ridged waveguide 5b. In this way, a light generated along the striped shape of the ridged waveguide 5b is reflected by the two cleavage surfaces (mirror surfaces) and repeatedly reciprocated through the active layer, while at the same time inducing carrier recombination one after another so as to effect an induced emission, thereby emitting a laser light having a predetermined wavelength (for example, around 405 nm) from the cleavage surfaces.

The second light emitting element 2b includes a laser oscillation section 10b having formed thereon a waveguide (stripe-shaped ridged waveguide) 8b and an ohmic electrode layer 6a, an insulating layer 7a interposed between the laser oscillation section 10b and the SOG 3a except the ohmic electrode layer 9b, a stripe-shaped conductive wiring layer Qb2 electrically connected with the ohmic electrode layer 9b and extending along the protruding portion STGb, and an ohmic electrode Pb2 formed on the top surface of the semiconductor substrate 10b.

The laser oscillation section 10b has a double hetero structure (DH) and the foregoing ridged waveguide 8b. The double hetero structure (DH) includes an active layer having a distorted quantum well structure consisting of an III-V compound semiconductor (for example, AlGaInP based semiconductor) containing arsenic (As), phosphorus (P), or antimony (Sb) as group V element. The double hetero structure (DH) also includes two clad layers laminated together with the active layer interposed therebetween.

Moreover, as will be described in detail later, a trapezoid portion formed by shaping the SOG 3b is provided on the insulating layer 7b on the protruding portion STGb side. The conductive wiring layer Qb2 extends on the trapezoid portion, thereby forming an electrode for supplying a drive current from outside.

In this way, once a drive current is supplied between the exposed wiring layer Qb2 and the ohmic electrode Pb2, such a drive current will flow into the ridged waveguide 8b through the ohmic electrode layer 9b, and further into the active layer in the laser oscillation section 10b along the striped shape of the ridged waveguide 8b, thereby emitting a light.

Further, a laser resonator is formed by virtue of cleavage surfaces (mirror surfaces) formed on both ends of the elongated ridged waveguide 8b. In this way, alight generated along the striped shape of the ridged waveguide 8b is reflected by the two cleavage surfaces (mirror surfaces) and repeatedly reciprocated through the active layer, while at the same time inducing carrier recombination one after another so as to effect an induced emission, thereby emitting a laser light having a predetermined wavelength (for example, around 650 nm) from the cleavage surfaces.

By virtue of the above-described structure, the semiconductor laser device LDB enables the first light emitting element 1b and the second light emitting element 2b to emit light individually and respectively. Further, it is also possible for the first and second light emitting elements to emit light simultaneously.

Next, description will be given to explain a process of manufacturing the semiconductor laser device LDB having the above-described structure, with reference to FIGS. 8 to 11.

At first, an intermediate body 300 for forming the first light emitting element 1b is manufactured at steps shown in FIGS.

8(a) to 8(e), and another intermediate body 400 for forming the second light emitting element 2b is manufactured at steps shown in FIGS. 9(a) to 3(e).

<A First Step for Manufacturing the Intermediate Body 300>

The intermediate body 300 is formed in a procedure which can be described as follows. At first, as shown in FIG. 8(a), MOCVD method or the like is employed so that a plurality of semiconductor films consisting of GaN based semiconductor and having different compositions and different thicknesses are laminated on GaN based semiconductor, or more specifically, on n-type GaN (0001) substrate SUB1, thereby forming GaN based film layer 4X equivalent to various layers 4ab to 4ah shown in FIG. 1(b), i.e., forming a GaN based semiconductor including an active layer having the above-mentioned multiple quantum well structure and a clad layer.

Namely, a base layer 4ab consisting of n-type GaN formed by doping silicon (Si) is laminated on the semiconductor substrate SUB at a thickness of about 5-15 μm. Next, an n-type clad layer consisting of n-type $Al_{0.08}Ga_{0.92}N$ is laminated at a thickness of about 0.8 μm, followed by laminating a guide layer consisting of n-type GaN at a thickness of about 0.2 μm. Next, an active layer is laminated at a thickness of about several tens of nm, which has a multiple quantum well structure including a well layer and a barrier layer consisting of $In_{0.08}Ga_{0.92}N$, and $In_{0.01}Ga_{0.99}N$. Next, an electronic barrier layer consisting of $Al_{0.2}Ga_{0.8}N$ is laminated at a thickness of about 0.02 μm, followed by laminating p-type guide layer consisting of p-type GaN formed by doping magnesium (Mg), at a thickness of about 0.2 μm. Then, p-type clad layer consisting of p-type $Al_{0.08}Ga_{0.92}N$ is laminated at a thickness of about 0.4 μm, followed by laminating p-side contact layer consisting of p-type GaN at a thickness of about 0.1 μm, thereby forming GaN based film layer 4X.

<A Second Step for Manufacturing the Intermediate Body 300>

Next, as shown in FIG. 8(b), a plurality of ridged waveguides 5b are formed on the GaN based film layer 4X, followed by forming thereon ohmic electrode layers 6a.

Namely, a mask in conformity with the shape of the plurality of ridged waveguides 5b is formed in <1-100> direction on the foregoing p-side contact layer, followed by etching the portions exposed from the mask using a reactive ion etching (RIE) process.

Here, the foregoing p-type guide layer is etched until its thickness becomes about 0.05 μm, thereby forming a plurality of stripe-shaped ridged waveguides 5b.

Next, the mask is removed and vapor deposition is performed to form ohmic electrode layers 6b consisting of Pd, Au or their alloy on the tops of the ridged waveguides 5b, at a thickness of about 200 nm.

<A Third Step for Manufacturing the Intermediate Body 300>

Next, as shown in FIG. 8(c), an insulating layer 7b consisting of $ZrO_2$ is formed on the surface of GaN based film layer 4X except the ohmic electrode layers 6b.

<A Fourth Step for Manufacturing the Intermediate Body 300>

Next, as shown in FIG. 8(d), vapor deposition is performed to form a wiring layer Qb1 consisting of Au and having a predetermined width on the ohmic electrode layers 6b and the insulating layers 7b, in a manner such that such wiring layer is substantially orthogonal to the longitudinal direction of the ridged waveguides 5b. At this time, the wiring layer Qb1 and the ohmic electrode layers 6b are electrically connected with each other.

<A Fifth Step for Manufacturing the Intermediate Body 300>

Next, as shown in FIG. 8(e), SOG 3b of $SiO_2$ based material is formed on the entire surface of the GaN based film layer 4X, thereby producing a final intermediate body 300.

<A First Step for Manufacturing the Intermediate Body 400>

Next, an intermediate body 400 is produced in the following procedure. At first, as shown in FIG. 9(a), MOCVD process is performed to form an etching stop layer STP consisting of InGaP on the top surface of an III-V compound semiconductor, more specifically, on the top surface of n-type GaAs (001) semiconductor substrate SUB 2, followed by laminating thereon an AlGaInP based film layer 10X equivalent to various layers 10aa-10ae shown in FIG. 1(b), i.e., AlGaInP based film layer 10X having an active layer of distorted quantum well structure and a clad layer.

Namely, after forming the etching stop layer STP on the top surface of the semiconductor substrate SUB 2, a buffer layer consisting of n-type GaAs formed by doping Si is formed on the etching stop layer STP at a thickness of about 0.5 μm, followed by laminating thereon an n-type clad layer consisting of n-type $Al_{0.35}Ga_{0.15}In_{0.5}P$ at a thickness of about 1.2 μm, as well as an n-type guide layer consisting of AlGaInP at a thickness of about 0.05 μm.

Next, an active layer of distorted quantum well structure consisting of GaInP and AlGaInP is laminated at a thickness of several tens of nm, followed by laminating p-type guide layer consisting of AlGaInP at a thickness of about 0.05 μm. Then, p-type clad layer consisting of $Al_{0.35}Ga_{0.15}In_{0.05}P$ formed by doping Zn is laminated at a thickness of about 1.2 μm, followed by laminating an electrically conductive layer consisting of p-type $Ga_{0.5}1In_{0.49}P$ at a thickness of about 0.05 μm, followed by laminating p-side contact layer consisting of p-type GaAs at a thickness of about 0.2 μm, thereby forming an AlGaInP based film layer 10X.

<A Second Step for Manufacturing the Intermediate Body 400>

Next, as shown in FIG. 9(b), a mask is formed on AlGaInP based film layer 10X in a manner such that a plurality of ridged waveguides 8b along <110 direction are formed at the same interval as the ridged waveguides 5b shown in FIG. 8(b). Then, a wet etching is performed to etch portions exposed from the mask, using an etching liquid having a ratio of sulfuric acid:hydrogen peroxide water:water of 4:1:1.

Here, such an etching is continued until p-type clad layer arrives at a thickness of about 0.2 μm, thereby forming a plurality of stripe-shaped ridged waveguides 8b.

Next, after removing the above-mentioned mask, ohmic electrode layers 9b consisting of Cr, Au or their alloy are formed on the ridged waveguides 8b.

<A Third Step for Manufacturing the Intermediate Body 400>

Next, an insulating layer 11b consisting of $SiO_2$ is formed on the surface of AlGaInP based film layer 10X except the ohmic electrode layers 9b.

<A Fourth Step for Manufacturing the Intermediate Body 400>

Next, as shown in FIG. 9(d), vapor deposition is performed to form a wiring layer Qb2 consisting of Au and having a predetermined width on the ohmic electrode layers 9b as well as on the insulating layer 11b, in almost orthogonal relation with the longitudinal direction of the ridged waveguides 8b. At this time, the wiring layer Qb2 and the ohmic electrode layers 9b are electrically connected with each other.

<A Fifth Step for Manufacturing the Intermediate Body 400>

Next, as shown in FIG. 9(e), SiO$_2$ based SOG 3b is formed on the entire surface of the AlGaInP based film layer 10X, thereby producing a final intermediate body 400.

<A First Step for Manufacturing the Semiconductor Laser Device LDB>

Figure 10:
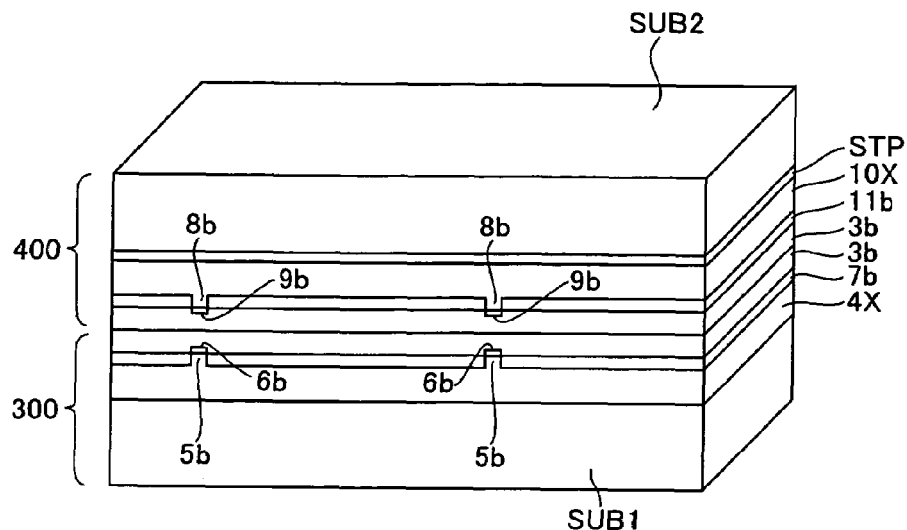
FIG. 10 provides further perspective views schematically showing a process of manufacturing the semiconductor laser device shown in FIG. 7.
Figure 10:
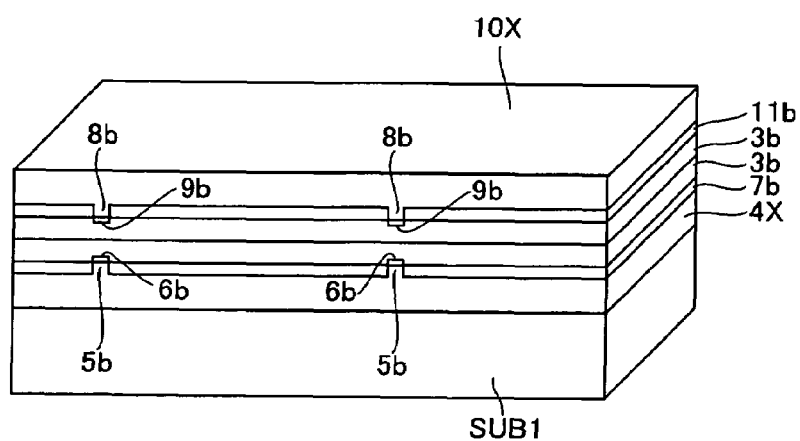
Figure 10:
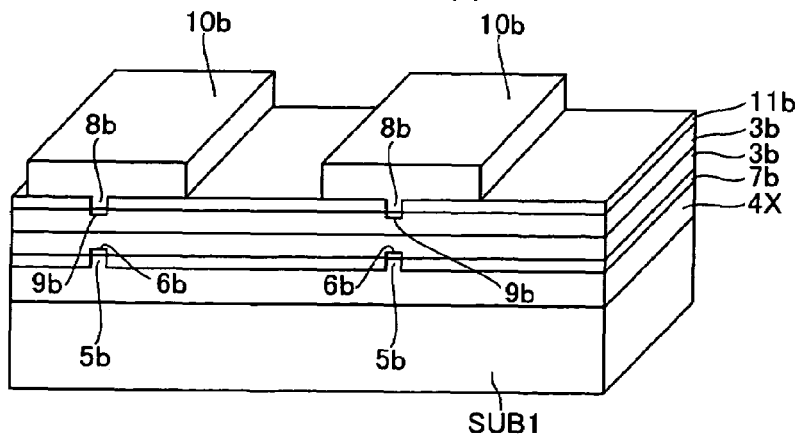
Figure 11:
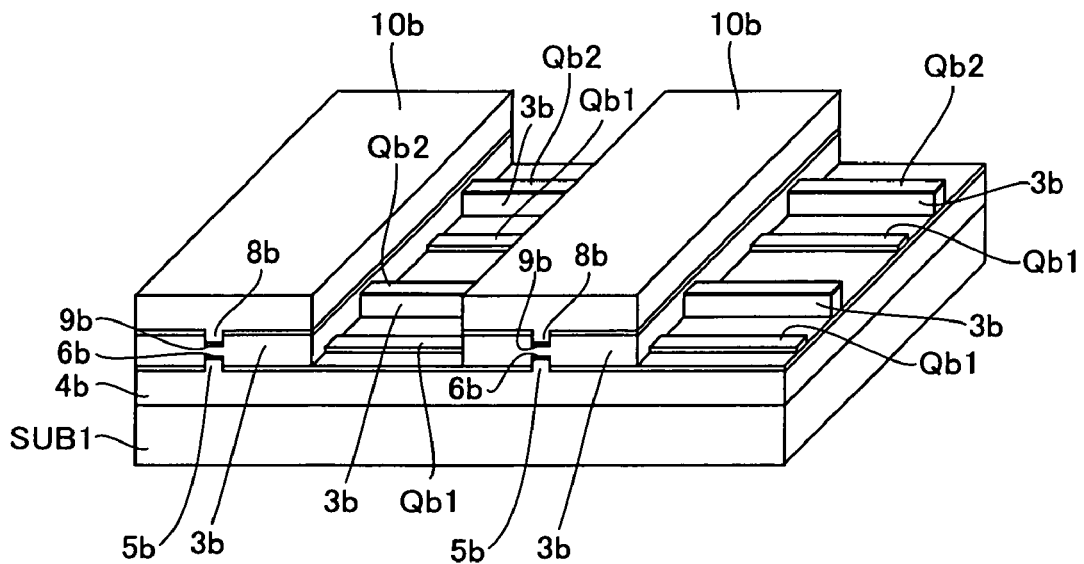
FIG. 11 provides further perspective views schematically showing a process of manufacturing the semiconductor laser device shown in FIG. 7.
Figure 11:
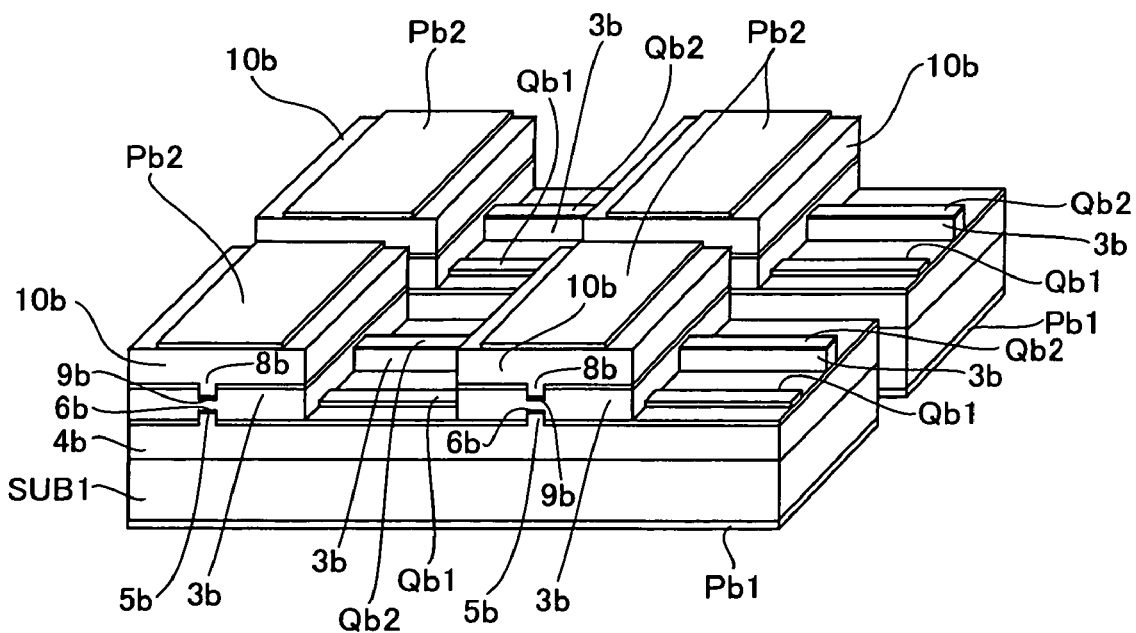

Next, the semiconductor laser device LDB is manufactured from the intermediate bodies 300, 400 produced in advance, according to the steps shown in FIGS. 10 and 11.

First, as shown in FIG. 10(a), the ridged waveguides 5b and 8b of the finally produced intermediate bodies 300, 400 are arranged to face each other. Then, the cleavage surface (1-100) of the GaN based film layer 4X and the cleavage surface (110) of the AlGaInP based film layer 10X are aligned with each other, so as to tightly bond together the SOG 3a of the intermediate body 300 and the SOG 3a of the intermediate body 400.

Furthermore, under a condition in which the two SOGs 3a have been tightly bonded together, heating is performed at a temperature of about 550° C. so as to make the SOG 3a of the intermediate body 300 and the SOG 3a of the intermediate body 400 to be formed into an integral body, and to allow the wiring layer Qb2 formed within the intermediate body 400 to be buried into the SOG 3a.

<A Second Step for Manufacturing the Semiconductor Laser Device LDB>

Next, as shown in FIG. 10(b), a semiconductor substrate SUB2 of n-type GaAs is wet-etched by an etching liquid having a ratio of sulfuric acid:hydrogen peroxide water:water of 4:1:1. Subsequently, an etching stop layer STP exposed due to the wet etching is removed by performing a further etching operation using an etching liquid having a ratio of hydrochloric acid:water of 1:1, thereby exposing the AlGaInP based film layer 10X.

Namely, a buffer layer is exposed which consists of n-type GaAs described in the first step for manufacturing the above-mentioned intermediate body 400.

<A Third Step for Manufacturing the Semiconductor Laser Device LDB>

Next, as shown in FIG. 10(c), mask is arranged in areas for forming the laser oscillation sections 10b, and a wet-etching is performed to remove some portions of the AlGaInP based film layer 10X which are exposed from the mask.

In this way, as shown in FIG. 10(c), a plurality of laser oscillation sections 10b are formed and the insulating layers 11b located between the respective laser oscillation sections 10b are thus exposed.

<A Fourth Step for Manufacturing the Semiconductor Laser Device LDB>

Next, as shown in FIG. 11(a), a dry etching operation using CF$_4$ gas is performed on the exposed insulating layers 11b and SOGs 3b, thereby exposing the wiring layers Qb1, Qb2 and forming the trapezoid SOGs 3b.

That is, when the dry etching is performed using CF$_4$ gas, SiO$_2$ insulating layer 11b is etched, while the Au wiring layers Qb1 and Qb2 are not etched, followed by etching SiO$_2$ based SOGs b3 except the portions located on the lower sides of the wiring layers Qb2. As a result, as shown in FIG. 11(a), trapezoid SOGs 3b are left, so are the wiring layers Qb2 on the trapezoid SOGs 3b, as well as the wiring layers Qb1 on the insulating layers 7b formed of ZrO$_2$.

In this way, since it is possible to expose the wiring layers Qb1 and Qb2 necessary for wiring and to remove some unwanted portions by virtue of an exposure only based on a dry etching using CF$_4$ gas, it is allowed to simplify the whole process for the manufacturing.

<A Fifth Step for Manufacturing the Semiconductor Laser Device LDB>

Next, as shown in FIG. 11(b), vapor deposition is performed to form the ohmic electrodes Pb2 consisting of AuGe alloy on the exposed surfaces (top surfaces) of the laser oscillation sections 10b, and to form the ohmic electrodes Pb1 consisting of Ti, Au or their alloy on the bottom surface of n-type GaN semiconductor substrate SUB 1. Subsequently, a cleaving operation is performed along the (1-100) surface which is a cleavage plane of the GaN based film layer 4X, thereby forming laser resonators.

Furthermore, a secondary cleaving operation is performed in a direction perpendicular to the laser resonators through the wiring layers Qb1 and Qb2, thereby completing the semiconductor laser device LDB having the first and second light emitting elements 1b and 2b shown in FIG. 7.

In this way, according to the semiconductor laser device LDB, since it is possible to fix together the laser oscillation sections 4b and 10b by virtue of the SOGs 3b (having a small thickness), it is possible to reduce an interval between the light emitting points on the laser oscillation sections 4b and 10b. In other words, since the semiconductor laser device LDB has a structure in which the laser oscillation sections 4b and 10b are fixed together by virtue of the thin SOGs 3b, it is possible to reduce an interval between the active layer of the laser oscillation section 4b and the active layer of the laser oscillation section 10b, thereby making it possible to reduce an interval between the light emitting point located in the active layer of the laser oscillation section 4b and the light emitting point located in the active layer of the laser oscillation section 10b.

Moreover, since the ohmic electrode layers 6a and 9a on the p-type semiconductor side are formed only on the ridged waveguides 5a and 8a, the laser oscillation sections 4b and 10b have small parasitic capacitances, thereby making it possible to improve the response characteristics of the laser oscillation sections 4a and 10a, i.e., a high frequency response characteristic of a drive current.

Moreover, since the laser oscillation sections 4b and 10b are electrically separated from each other by SOGs 3b, it is possible to effect light emissions either individually or simultaneously. Further, even if only one of the first and second light emitting elements 1b and 2b is caused to emit a light, the other of the first and second light emitting elements 1b and 2b will not be in an inversed bias state.

In addition, when the semiconductor laser device LDB is mounted on an optical pickup which performs information recording or information reproducing on CD, DVD or other storage medium, the reduced interval between light emitting points makes it possible for the respective light emitting points on the first and second light emitting elements 1b and 2b to be all positioned adjacent to the optical axis of the optical system of the optical pickup, thereby making it possible to greatly inhibit the occurrence of an aberration or the like.

Besides, according to the manufacturing method of the present embodiment, after the intermediate bodies 300 and 400 capable of producing a plurality of the first and second light emitting elements 1b and 2b are fixed together by virtue of the SOGs 3b, cleaving or scribing or the like is performed to divide the block into the respective semiconductor laser devices LDB. In this way, it is possible to realize an optimum control of an interval between the light emitting points of the first and second light emitting elements 1b and 2b, in only one operation of fixing together the intermediate bodies 300 and 400. Meanwhile, it is also possible to effect a desired positioning at a high precision, thereby realizing a simplified manufacturing process or the like.

Furthermore, according to the manufacturing method of the present embodiment, in the steps shown in FIGS. 10(b) and 10(c) (the second and third steps for manufacturing the semiconductor laser device LDB), the insulating film 11b is exposed by processing n-type GaAs semiconductor substrate SUB and the AlGaInP based film layer 10X. In this way, since the GaN semiconductor substrate is used in the semiconductor substrate SUB1 on the first light emitting element 1b side, it is possible to produce GaN based film layer 4X having an acceptable crystallizing ability.

In this way, according to the present embodiment, it becomes possible to provide an improved semiconductor laser device LDB which can emit a plurality of laser lights having different wavelengths and has excellent electrical properties as well as a high mechanical precision. Besides, it is also possible to provide an improved manufacturing method capable of manufacturing the semiconductor laser device LDB at an improved productivity.

In addition, although the above description has been given based on an example in which a nitride based III-V compound semiconductor whose group V element consists of nitrogen (N) is used to form the laser oscillation section 4b serving as the main body portion of the first light emitting element 1b, it is also possible to replace the nitride based III-V compound semiconductor with II-VI compound semiconductor to form the laser oscillation section 4b.

Moreover, the insulating layer 11b can be formed by one of any other materials provided that it can be dry-etched by the foregoing $CF_4$ gas. Similarly, the insulating layer 7b can also be formed by one of any other materials provided that it can be dry-etched by the foregoing $CF_4$ gas.

The invention claimed is:

1. A semiconductor laser device which emits a plurality of laser lights having different wavelengths, said device comprising:
   a first laser oscillation section laminated on a semiconductor substrate; and
   a second laser oscillation section which oscillates at a wavelength different from the first laser oscillation section;
   wherein the first laser oscillation section's one surface located away from the semiconductor substrate and excluding its waveguide is fixedly combined with the second laser oscillation section's one surface located close to its light emitting portion and excluding its waveguide by virtue of insulating adhesive layers;
   said semiconductor laser device further comprises:
   first and second ohmic electrode layers formed on the surfaces of waveguides of the first and second laser oscillation sections; and
   first and second wiring layers formed between the first and second laser oscillation sections, electrically and individually connected with the first and second ohmic electrode layers,
   wherein the first laser oscillation section or the semiconductor substrate is partially exposed when viewed from the second laser oscillation section side, with the first and second wiring layers extending on the surface of the exposed portion, and
   wherein an insulating layer consisting of a material different from the adhesive layers is formed between the first wiring layer and the first laser oscillation section except an area of the ohmic electrode layer.

2. The semiconductor laser device according to claim 1 wherein the adhesive layers are SOG (spin on glass).

3. The semiconductor laser device according to claim 1, wherein:
   the semiconductor substrate consists of III-V compound semiconductor;
   the first laser oscillation section includes III-V compound semiconductor or II-VI compound semiconductor containing arsenic (As), phosphorus (P) or antimony (Sb) as group V element, the second laser oscillation section includes nitride based III-V compound semiconductor containing nitrogen (N) as group V element.

4. The semiconductor laser device according to claim 1 wherein:
   the first laser oscillation section includes nitride based III-V compound semiconductor containing nitrogen (N) as group V element,
   the second laser oscillation section includes III-V compound semiconductor or II-VI compound semiconductor containing arsenic (As), phosphorus (P) or antimony (Sb) as group V element.

5. A method of manufacturing a semiconductor laser device which emits a plurality of laser lights having different wavelengths, said method comprising the steps of:
   forming a first film layer containing at least an active layer and waveguides on a semiconductor substrate to produce a first intermediate body;
   forming a second film layer containing at least an active layer and waveguides on a support substrate to produce a second intermediate body;
   causing the waveguides of the first and second intermediate bodies to face each other and bonding together the first and second intermediate bodies by virtue of insulating adhesive layers; and
   removing the support substrate to expose the second film layer,
   wherein
   in the step of producing the first intermediate body, first ohmic electrode layers along the waveguides of the first film layer, a first wiring layer electrically connected with the first ohmic electrode layers, first insulating adhesive layers covering predetermined areas including the waveguides, and a second wiring layer are formed and thus laminated on one surface of the first film layer having the waveguides;
   in the step of producing the second intermediate body, second ohmic electrode layers along the waveguides of the second film layer are formed on one surface of the second film layer having the waveguides, and second insulating adhesive layers are formed in areas not including the second ohmic electrode layers, and
   in the step of fixing together the first and second intermediate bodies by virtue of insulating adhesive layers, the second wiring layer and the second ohmic electrode layers are electrically connected with each other so as to tightly bond together the first and second insulating adhesive layers, thereby fixing together the first and second intermediate bodies by virtue of the insulating adhesive layers.

6. The method according to claim 5, wherein the adhesive layers are SOG (spin on glass).

7. The method according to claim 5, wherein
   the semiconductor substrate consists of III-V compound semiconductor;

the first film layer includes III-V compound semiconductor or II-VI compound semiconductor containing arsenic (As), phosphorus (P) or antimony (Sb) as group V element, the second film layer includes nitride based III-V compound semiconductor containing nitrogen (N) as group V element.

8. The method according to claim 7, wherein the support substrate is a sapphire substrate or an AlN substrate, in the step of exposing the second film layer, a light is applied from the backside of the support substrate to an area adjacent to the junction between the support substrate and the second film layer, so as to heat and thus decompose the area near the junction.

9. The method according to claim 8, wherein said light has a wavelength of 360 nm or less.

10. A method of manufacturing a semiconductor laser device which emits a plurality of laser lights having different wavelengths, said method comprising the steps of:

forming a first film layer containing at least an active layer and waveguides on a first semiconductor substrate to produce a first intermediate body;

forming a second film layer containing at least an active layer and waveguides on a second semiconductor substrate to produce a second intermediate body;

causing the waveguides of the first and second intermediate bodies to face each other and bonding together the first and second intermediate bodies by virtue of insulating adhesive layers; and removing the second semiconductor substrate to expose the second film layer, wherein in the step of producing the first intermediate body, first ohmic electrode layers along the waveguides of the first film layer, a first wiring layer electrically connected with the first ohmic electrode layers, and first adhesive layers are formed and thus laminated on one surface of the first film layer having the waveguides;

in the step of producing the second intermediate body, second ohmic electrode layers along the waveguides of the second film layer, a second wiring layer electrically connected with the second ohmic electrode layers, and second adhesive layers are formed and thus laminated on one surface of the second film layer having the waveguides, and in the step of fixing together the first and second intermediate bodies by virtue of the adhesive layers, the first and second adhesive layers are tightly bonded together so as to bond together the first and second intermediate bodies.

11. The method according to claim 10, wherein in the step of producing the first intermediate body, insulating layers covering areas not including the first ohmic electrode layers and formed of a material different from the adhesive layers are formed on the first film layer's one surface having the waveguides, followed by forming, on the insulating layers, the first wiring layer electrically connected with the first ohmic electrode layers.

12. The method according to claim 11, wherein subsequent to the step of removing the second semiconductor substrate to expose the second film layer, the second film layer and the adhesive layers are partially etched to partially expose the wiring layer and the insulating layer.

13. The method according to claim 10, wherein said adhesive layer is SOG (spin on glass).

14. The method according to claim 10, wherein:

the first semiconductor substrate consists of nitride based III-V compound semiconductor containing nitrogen (N) as group V element the first film layer consists of nitride based III-V compound semiconductor containing nitrogen (N) as group V element, the second semiconductor substrate consists of III-V compound semiconductor, the second film layer includes III-V compound semiconductor or II-VI compound semiconductor containing arsenic (As), phosphorus (P) or antimony (Sb) as group V element.

\* \* \* \* \*